United States Patent
Nagai et al.

(10) Patent No.: US 7,052,979 B2
(45) Date of Patent: May 30, 2006

(54) PRODUCTION METHOD FOR SEMICONDUCTOR CRYSTAL AND SEMICONDUCTOR LUMINOUS ELEMENT

(75) Inventors: Seiji Nagai, Aichi (JP); Kazuyoshi Tomita, Aichi (JP); Shiro Yamazaki, Aichi (JP); Yuta Tezen, Aichi (JP); Toshio Hiramatsu, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/467,566

(22) PCT Filed: Feb. 12, 2002

(86) PCT No.: PCT/JP02/01159

§ 371 (c)(1),
(2), (4) Date: Oct. 9, 2003

(87) PCT Pub. No.: WO02/064864

PCT Pub. Date: Aug. 22, 2002

(65) Prior Publication Data

US 2004/0123796 A1    Jul. 1, 2004

(30) Foreign Application Priority Data

Feb. 14, 2001 (JP) .............................. 2001-036604
Mar. 30, 2001 (JP) .............................. 2001-98870
Sep. 11, 2001 (JP) .............................. 2001-274376

(51) Int. Cl.
*H01L 21/20* (2006.01)
(52) U.S. Cl. ...................... 438/478; 438/481
(58) Field of Classification Search ............... 438/478, 438/479, 481; 117/95, 97, 913, 915, 923, 117/952
See application file for complete search history.

(56) References Cited

U.S. PATENT DOCUMENTS 4,677,250 A * 6/1987 Barnett et al. .............. 136/258
5,185,290 A    2/1993 Aoyagi et al.

(Continued)

FOREIGN PATENT DOCUMENTS

EP    0 551 721 A2    7/1993

(Continued)

OTHER PUBLICATIONS

PCT Forms 338 and 409 (IPER) (PCT/JP02/05446) and translations thereof.

(Continued)

*Primary Examiner*—Tuan H. Nguyen
(74) *Attorney, Agent, or Firm*—McGinn IP Law Group, PLLC

(57) ABSTRACT

When a substrate layer (desired semiconductor crystal) made of a group III nitride compound is grown on a base substrate comprising a lot of projection parts, a cavity in which a semiconductor crystal is not deposited may be formed between each projection part although it depends on conditions such as the size of each projection part, arranging interval between each projection part and crystal growth. So when the thickness of the substrate layer is sufficiently larger compared with the height of the projection part, inner stress or outer stress become easier to act intensively to the projection part. As a result, such stress especially functions as shearing stress toward the projection part. When the shearing stress becomes larger, the projection part is ruptured. So utilizing the shearing stress enables to separate the base substrate and the substrate layer easily. The larger the cavities are formed, the more stress tends to concentrate to the projection parts, to thereby enable to separate the base substrate and the substrate layer more securely.

5 Claims, 11 Drawing Sheets

U.S. PATENT DOCUMENTS

| | | | |
|---|---|---|---|
| 5,798,536 A | 8/1998 | Tsutsui | |
| 5,828,088 A * | 10/1998 | Mauk | 257/98 |
| 6,051,849 A | 4/2000 | Davis et al. | |
| 6,110,277 A | 8/2000 | Braun | |
| 6,121,121 A | 9/2000 | Koide | |
| 6,146,457 A | 11/2000 | Solomon | |
| 6,153,010 A | 11/2000 | Kiyoku et al. | |
| 6,177,688 B1 * | 1/2001 | Linthicum et al. | 257/77 |
| 6,255,198 B1 * | 7/2001 | Linthicum et al. | 438/481 |
| 6,261,929 B1 * | 7/2001 | Gehrke et al. | 438/478 |
| 6,265,289 B1 * | 7/2001 | Zheleva et al. | 438/503 |
| 6,274,518 B1 | 8/2001 | Yuri et al. | |
| 6,316,785 B1 | 11/2001 | Nunoue et al. | |
| 6,319,742 B1 | 11/2001 | Hayashi et al. | |
| 6,329,667 B1 | 12/2001 | Ota et al. | |
| 6,355,497 B1 | 3/2002 | Romano et al. | |
| 6,365,921 B1 | 4/2002 | Watanabe et al. | |
| 6,380,108 B1 * | 4/2002 | Linthicum et al. | 438/791 |
| 6,403,451 B1 * | 6/2002 | Linthicum et al. | 438/479 |
| 6,720,586 B1 * | 4/2004 | Kidoguchi et al. | 257/103 |

FOREIGN PATENT DOCUMENTS

| | | |
|---|---|---|
| EP | 0 779 666 A3 | 6/1997 |
| EP | 0 951 055 A2 | 10/1999 |
| EP | 0 993 048 A2 | 4/2000 |
| EP | 1 045 431 A1 | 10/2000 |
| EP | 1 059 661 A2 | 12/2000 |
| EP | 1 059 677 A2 | 12/2000 |
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-133182 | 6/1991 |
| JP | 4-10665 | 1/1992 |
| JP | 4-84418 | 3/1992 |
| JP | 4-303920 | 10/1992 |
| JP | 5-41536 | 2/1993 |
| JP | 5-110206 | 4/1993 |
| JP | 5-283744 | 10/1993 |
| JP | 5-343741 | 12/1993 |
| JP | 6-196757 | 7/1994 |
| JP | 7-249830 | 9/1995 |
| JP | 7-273367 | 10/1995 |
| JP | 8-64791 | 3/1996 |
| JP | 8-102549 | 4/1996 |
| JP | 8-116090 | 5/1996 |
| JP | 8-222812 | 8/1996 |
| JP | 8-274411 | 10/1996 |
| JP | 9-162125 | 6/1997 |
| JP | 10-312971 | 11/1998 |
| JP | 10-321954 | 12/1998 |
| JP | 11-31864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-21789 | 1/2000 |
| JP | 2000-44121 | 2/2000 |
| JP | 2000-91253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-331937 A * | 11/2000 |
| JP | 2000-331947 A * | 11/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | PCT WO 97/11518 | 3/1997 |
| WO | PCT WO 98/47170 | 10/1998 |
| WO | PCT WO 99/01594 | 1/1999 |
| WO | PCT WO 00/04615 | 1/2000 |
| WO | PCT WO 00/55893 | 9/2000 |
| WO | PCT WO 02/058120 A1 | 7/2002 |

OTHER PUBLICATIONS

PCT Forms 338 and 409 (IPER) (PCT/JP02/02628) and translations thereof.

PCT Forms 338 and 409 (IPER) (PCT/JP02/01159) and translations thereof.

D. Kapolnek et al., "Anisotropic epitaxial lateral growth in GaN selective area epitaxy", Appl. Phys. Lett. 71(9), Sep. 1, 1997, pp. 1204-1206.

Matsushima et al., "Selective growth of GaN on sub-micron pattern by MOVPE", Technical Report of IEICE, ED97-32, CPM97-20 (May 1997) pp. 41-46.

Ujiie et al., "Epitaxial Lateral Overgrowth of GaAs on a Si Substrate", Japanese Journal of Applied Physics vol. 28, No. 3, Mar., 1989, pp. L337-L339.

Partial Translation of the Office Action for Japanese Patent Application No. 9-311518 dated Jun. 10, 2003.

Nam et al., "Lateral epitaxy of low defect density GaN layers via organometallic vapor phase epitaxy", pp. 2638-2640, Appl. Phys. Lett. 71 (18), Nov. 3, 1997.

Hiramatsu et al., "Selective area growth and epitaxial lateral overgrowth of GaN by metalorganic vapor phase epitaxy and hydride vapor phase epitaxy", pp. 104-111, Materials Science and Engineering B59 (1999).

Akasaki et al., "Effects of AlN Buffer Layer on Crystallographic Structure and on Electrical and Optical Properties of GaN and Ga1-xAlxN . . . Movpe" pp. 209-219, Journal of Crystal Growth 98 (1989) North-Holland, Amsterdam.

Yang et al., High quality GaN-InGaN heterostructures grown on (111) silicon substrates, pp. 3566-3568, Appl. Phys. Lett. 69 (23), Dec. 2, 1996.

Wolf et al., "Silicon Processing for the VLSI Era," vol. 1, Lattice Press, 1986, p. 5.

Luther et al., "Titanium and titanium nitride contacts to n-type gallium nitride", Semicond. Sci. Technol. 13 (1998) pp. 1322-1327.

Dimitriadis et al., "Contacts of titanium nitride to—and p-type gallium nitride films", Solid-State Electronics 43 (1999), pp. 1969-1972.

Zheleva et al., "Pendeo-Epitaxy-A New Approach for Lateral Growth of Galium Nitride Structures", MRS Internet J. Nitride Semicond. Res. 4SI, G3.38 (1999), 6 pages total.

Uchida et al., "AlGaInN based Laser Diodes", In-Plans Semiconductor Lasers IV, III-Vs Review vol. 13, No. 3, May/Jun. 2000, pp. 156-164.

Zheleva et al., Pendeo-Epitaxy versus Lateral Epitaxial Overgrowth of GaN: A Comparative Study via Finite element Analysis, Journal of electronic Materials, vol. 28, No. 4, Apr. 1999, pp. 545-551.

Zheleva et al., "Pendeo-Epitaxy: A New Approach for Lateral Growth of Gallium Nitride Films", Journal of Electronic Materials, vol. 28, No. 4, 1999, pp. L5-L8.

PCT Form 210 (PCT/JP02/05446).
PCT Form 210 (PCT/JP02/02628).
PCT Form 210 (PCT/JP02/01159).
PCT Form 210 (PCT/JP01/01928).
PCT Form 210 (PCT/JP01/02695).
PCT Form 210 (PCT/JP00/09120).
PCT Form 210 (PCT/JP01/01396).
PCT Form 210 (PCT/JP01/01178).
PCT Form 210 (PCT/JP01/01663).
PCT Form 210 (PCT/JP00/09121).
PCT Form 210 (PCT/JP00/09220).
PCT Form 338 and 409 (IPER) (PCT/JP01/02695).
PCT Form 338 and 409 (IPER) (PCT/JP01/01663) and translation thereof.
PCT Form 338 and 409 (IPER) (PCT/JP00/09120) and translation thereof.
PCT Form 338 and 409 (PCT/JP01/01928) and translation thereof.
PCT Form 338 and 409 (PCT/JP01/01396) and translation thereof.

Search Report (EP 27057) dated Jul. 18, 2000.
Search Report (EP 27279) dated Feb. 15, 2002.

Ishikawa, et al., "MOCVD growth of GaN on Si substrate" pp. 191-196.

Tanaka, et al., "TEM observation of selective area growth GaN pyramid on (111)Si" pp. 197-202.

Dadgar, et al., "Metalorganic Chemical Vapor Phase Epitaxy of Crack-Free GaN on Si(111) Exceeding 1um in Thickness" J. Appl. Phys. vol. 39 (2000) Pt. 2 No. 11B. pp. L1183-L1185.

Sato, et al., "A New Substrate Engineering for the Formation of Empty Space in Silicon (ESS) Induced by Silicon by Silicon Surface Migration" 1999 IEEE IEDM pp. 99-517-520.

Ishikawa, et al. "GaN on Si Substrate with AlGaN/AlN Intermediate Layer" Jpn.J.Appl. Phys. vol. 38 (1999) pp. L492-494 Part 2, No. 5A, May 1, 1999.

Ejeckam, et al., "Dislocation-free InSb grown on GaAs compliant universal substrates" Appl.Phys.Lett. 71 (6), Aug. 11, 1997, pp. 776-778.

English Abstract of the Office Action dated Oct. 15, 2005, in counterpart Korean Patent Application No. 10-2003-7010636.

Concise Explanation of Japanese Patent Application Laid-open No. 2000-106455.

* cited by examiner

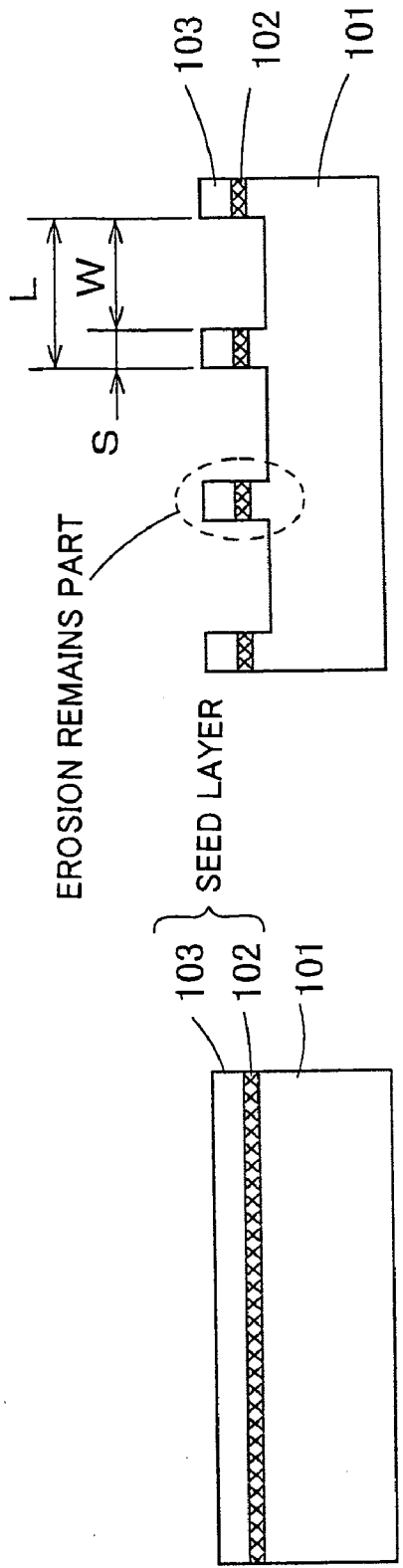
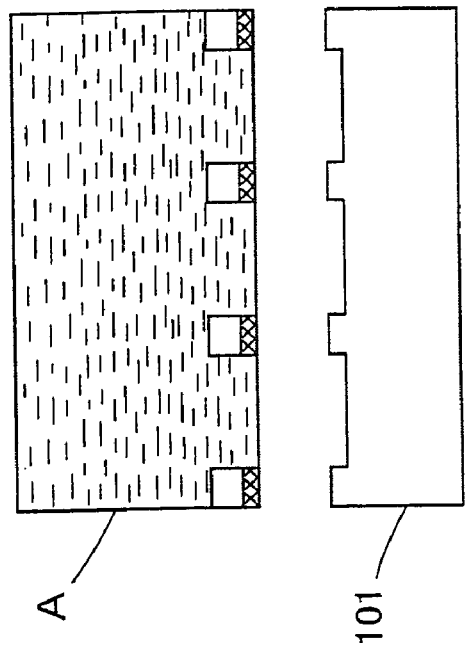
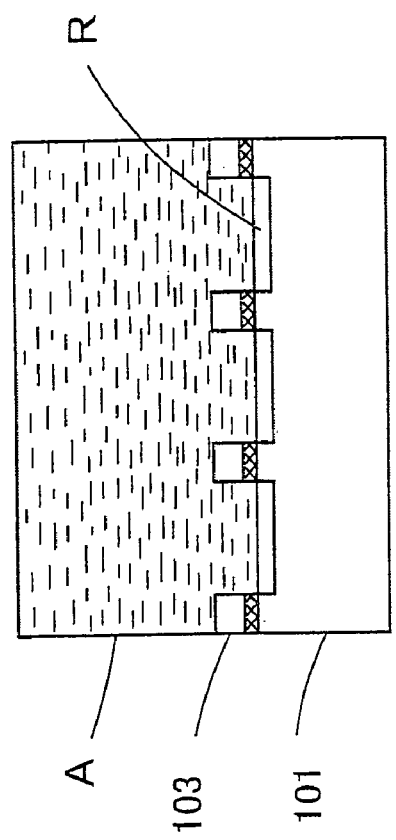
FIG. 9A
FIG. 9B
FIG. 9C
FIG. 9D

US 7,052,979 B2

PRODUCTION METHOD FOR SEMICONDUCTOR CRYSTAL AND SEMICONDUCTOR LUMINOUS ELEMENT

TECHNICAL FIELD

The present invention relates to a method for producing semiconductor crystal comprising a step of forming a substrate layer comprising group III nitride compound semiconductor on a base substrate using lateral crystal growth effect to thereby obtain a substrate for a crystal growth.

And the present invention relates to a method for producing a semiconductor substrate by growing a crystal of group III nitride compound semiconductor on a base substrate consisting of silicon (Si). The present invention also relates to a group III nitride compound semiconductor device formed on such a semiconductor substrate obtained by above method.

Further, the present invention relates to a method for growing a semiconductor crystal made of group III nitride compound semiconductor on a base substrate, to thereby obtain a semiconductor crystal which has excellent quality and is independent from the base substrate.

And the present invention can be applied to a production of a crystal growth substrate for various semiconductor devices represented by e.g., LEDs.

BACKGROUND ART

As shown in FIG. 10 and as is widely known, when a group III nitride compound semiconductor such as gallium nitride (GaN) formed by crystal growth on a base substrate which is made of, e.g., silicon (Si), is cooled to ambient temperature, a number of dislocations and cracks are generated in the grown nitride compound semiconductor layer.

FIG. 11 is a schematic cross-sectional view showing a conventional semiconductor crystal formed on a Si substrate (a base substrate) by crystal growth. MOCVD is applied in a process of crystal growth of the semiconductor crystal. As shown in FIG. 11, a semiconductor crystal (e.g. GaN crystal) grown at a high temperature on a Si substrate (base substrate) by using a conventional technique has a reaction part, dislocations and cracks.

A conventional technique in which a semiconductor crystal consisting of a group III nitride compound semiconductor is grown on a base substrate and a free-standing semiconductor crystal is obtained independently from the base substrate is generally known as, for example, wet etching disclosed in a Japanese Patent Application Laid-Open (kokai) No. 7-202265 entitled "Manufacture of Group III Nitride Semiconductor" and a method comprising steps of growing a thick GaN (semiconductor crystal to be obtained) on a sapphire substrate by using HVPE or other process and removing the sapphire substrate by irradiating laser or polishing.

DISCLOSURE OF THE INVENTION

When a number of dislocations and cracks are generated in the grown layer (nitride semiconductor layer), a number of lattice defects, dislocations, deformation, cracks, etc., are generated in a device fabricated on the semiconductor layer, thereby deteriorating device characteristics.

When the base substrate consisting of silicon (Si) except for the grown layer is removed so as to obtain a free-standing substrate (crystal), the substrate cannot have larger area (1 cm$^2$ and bigger) because of dislocations and cracks described above.

Dislocations and cracks are occurred because of stress which is generated owing to difference of thermal expansion coefficients and difference of lattice constants between different kinds of materials. So when such a crystal growth substrate is used for fabricating each kind of semiconductor devices, device characteristics of the device is deteriorated.

At the temperature for crystal growth of a objective semiconductor substrate (semiconductor crystal A), or around 1000° C. to 1150° C., silicon (Si) and gallium nitride (GaN) happen to react to form a polycrystalline GaN ("reaction part" in FIG. 10). As a result, it is not easy to obtain a single crystalline GaN substrate by applying a crystal growing process in a high temperature.

In a conventional method, difference of thermal expansion coefficients and difference of lattice constants between the base substrate (e.g.: sapphire and silicon) and a group III nitride compound semiconductor results in applying stress to the objective single crystal (e.g.: GaN) when the semiconductor is cooled to ambient temperature after growing process, thereby generating a number of dislocations and cracks in the objective single crystal.

For example, when a nitride compound semiconductor layer such as a gallium nitride (GaN) is formed by crystal growth on a base substrate made of, e.g., sapphire or silicon (Si), and then the semiconductor layer is cooled to ambient temperature according to the above-described conventional method, difference of thermal expansion coefficients and difference of lattice constants generates stress, which generates a number of dislocations and cracks in the nitride compound semiconductor layer.

When a number of dislocations and cracks are generated in the grown layer (nitride semiconductor layer), a number of lattice defects, dislocations, deformation, cracks, etc., are generated in a device fabricated on the semiconductor layer, thereby deteriorating device characteristics.

Although the base substrate except for the objective grown layer is removed so as to obtain a free-standing substrate (crystal), the substrate cannot have larger area because of dislocations and cracks described above. When the objective single crystal is grown in a certain thickness, cracks are generated in the objective single crystal even during the growth process. That easily causes problems such that small pieces are partially peeled off.

The present invention has been accomplished in order to overcome the aforementioned drawbacks. Thus, an object of the present invention is to produce a high quality semiconductor crystal (crystal growth substrate) having low dislocation density and no cracks and which have excellent characteristics.

Other object of the present invention is to produce a semiconductor crystal of high quality having no crack or polycrystalline lump (reaction part) by using silicon (Si) which can be provided at comparatively low cost as a base substrate. Other object of the present invention is to produce semiconductor devices of high quality which are formed by using a high-quality semiconductor crystal as a crystal growth substrate.

Other object of the present invention is to produce a semiconductor of high quality crystal which is independent from the base substrate.

The following means may be useful to overcome the above-described drawbacks.

That is, the first aspect of the present invention provides a method for producing a free-standing semiconductor crystal which is independent from a base substrate, in which a substrate layer comprising group III nitride compound semiconductor is formed on the base substrate by applying a lateral crystal growth effect, comprising the steps of: projection part forming process for forming a number of a projection part on the base substrate; crystal growing process for growing the substrate layer by crystal growth until each grown surface is connected with each other and grows to become at least a series of approximately flat surface, using at least a portion of the surface of the projection part as an initial grown surface on which the substrate layer starts to grow; and separating process for separating the substrate layer and the base substrate by breaking the projection part.

As used herein, the term "group III nitride compound semiconductor" generally refers to a binary, ternary, or quaternary semiconductor having arbitrary compound crystal proportions and represented by $Al_xGa_yIn_{(1-x-y)}N$ ($0 \leq x \leq 1$; $0 \leq y \leq 1$; $0 \leq x+y \leq 1$). The group III nitride compound semiconductor of the present invention also encompasses such species containing a p-type or n-type dopant.

In the present specification, the group III nitride compound semiconductor also encompasses semiconductors in which the aforementioned Group III elements (Al, Ga, In) are partially substituted by boron (B), thallium (Tl), etc. or in which nitrogen (N) atoms are partially substituted by phosphorus (P), arsenic (As), antimony (Sb), bismuth (Bi), etc.

Examples of the p-type dopant which can be added include magnesium (Mg) and calcium (Ca).

Examples of the n-type dopant which can be added include silicon (Si), sulfur (S), selenium (Se), tellurium (Te), and germanium (Ge).

These dopants may be used in combination of two or more species, and a p-type dopant and an n-type dopant may be added simultaneously.

For example, as shown in FIG. 1, when a substrate layer (semiconductor crystal) made of group III nitride compound is formed on a base substrate having a number of projection parts, a cavity on which the semiconductor crystal is not deposited can be obtained at each interval (or each sidewall) of the projection part by controlling the size of the projection part, arranging interval between each projection part, and each condition of crystal growth. So when the thickness of the substrate layer is sufficiently larger compared with the height of the projection part, inner stress or outer stress become easier to act intensively on the projection part. As a result, such stress especially functions as shearing stress toward the projection part. When the shearing stress become larger, the projection part is ruptured. So utilizing the shearing stress enables to separate (exfoliate) the base substrate and the substrate layer easily. By employing this method, a free-standing crystal (substrate layer) can be obtained from the base substrate.

The larger the above described cavity is formed, the easier the stress (shearing stress) becomes intensive.

The projection part as explained above is formed as shown in FIG. 1. That limits contact part of the base substrate and the substrate layer (or a desired semiconductor crystal layer) narrowly, and distortion owing to difference of lattice constants of the base substrate and the substrate layer becomes difficult to be generated. As a result, the stress caused by difference of lattice constants of the base substrate and the substrate layer is relaxed. That surpresses unnecessary stress which acts to the growing substrate layer (desired semiconductor crystal) in crystal growing process and reduces generation of dislocations and cracks.

A portion of a substrate layer may be left on the base substrate in a process of separating (exfoliating) the substrate layer and the base substrate. Also alternatively, a portion of the base substrate (e.g.: rupture remains) may be left on the substrate layer. That is, completely removing the remains or portions of those layers, or completely separating each material of the substrate and the substrate layer, is not a premise (necessary condition) in the above-explained separating process.

The second aspect is drawn to a method according to the first aspect wherein the substrate layer and the base substrate are cooled or heated to generate stress owing to difference of thermal expansion coefficients of the substrate layer and the base layer and the projection part is broken by utilizing this stress.

This method enables to generate stress described above more easily.

The third aspect is drawn to a method for producing a semiconductor crystal in which a substrate layer comprising group III nitride compound semiconductor is formed on the base substrate by employing a lateral crystal growth effect, comprising the steps of: forming process for forming a number of projection part on the base substrate; and crystal growing process for growing the substrate layer by crystal growth until each grown surface is connected with each other and grows to become at least a series of approximately flat surface, using at least a portion of the surface of the projection part as an initial grown surface on which the substrate layer starts to grow. In this crystal growing process, the value of (b−a), or difference of crystal growth velocity 'b' of group III nitride compound semiconductor on the peak point of the projection part and crystal growth velocity 'a' of group III nitride compound semiconductor on at least a portion of the exposed region of each valley part (concave) at each interval of the projection parts of the base substrate, is controlled to become approximately maximum by controlling supply amount q of raw material of a group III nitride compound semiconductor.

By applying this method, crystal growth velocity around the peak part of the projection part becomes relatively larger, crystal growth around the exposed portions is comparatively suppressed and crystal growth around the peak point becomes dominant. As a result, degree of lateral growth (ELO, or epitaxial lateral overgrowth) of the substrate layer starting from around the peak point of the projection part becomes remarkable and stress caused by difference of lattice constants of the base substrate and the substrate layer is relaxed. Then, crystal structure of the substrate layer becomes stable and that reduces generation of dislocations and cracks in the substrate layer.

For example, when degree of lateral growth (ELO) of the substrate layer is remarkable, sidewalls of the projection part (interface of each projection part) may have comparatively large cavities.

As shown in FIG. 1, ruggedness having arbitrary size and interval is formed in arbitrary period on the surface of the base substrate, for example, generally concave part (valley part) tends to have smaller amount of crystal material supply per a unit time and a unit area compared with the upper portion of convex part (projection part) at the portion except for around peripheral sidewalls of the base substrate. The amount of crystal material supply also depends on flow rate, temperature and direction of crystal material gas. By controlling these conditions to be optimum and suitable, the difference (b−a) described above can be controlled to be the approximately maximum value.

The fourth aspect is drawn to the crystal growing process according to the first or the second aspect, wherein the value of (b−a), or difference of crystal growth velocity 'b' of group III nitride compound semiconductor on the peak point of the projection part and crystal growth velocity 'a' of group III nitride compound semiconductor on at least a portion of the exposed region of each valley part which is each interval of the projection parts of the base substrate, is controlled to become approximately maximum by controlling supply amount q of raw material of a group III nitride compound semiconductor.

Here, as in the third aspect, stress caused by difference of lattice constants of the base substrate and the substrate layer which acts to the substrate layer in crystal growing process is relaxed and crystal structure of the substrate layer becomes stable and that reduces generation of dislocations and cracks. That can be recognized remarkable comparatively when lateral growth is so remarkable that cavities are formed at each interval of projection part (sidewall of projection part).

Also, when cavities are formed at each sidewall of projection part (interval of projection part), shearing stress tends to concentrate on the projection part to thereby enable the base substrate and the substrate layer to separate with each other by the shearing stress in the separating process. That can be recognized remarkably in accordance with that cavities formed in each interval of projection parts (sidewall of projection part) become larger.

The fifth aspect is drawn to the crystal growing process according to the third or the fourth aspect wherein amount of material supply q is in a range from 1 μmol/min to 100 μmol/min.

More preferably, the amount of material supply q is in a range from 5 μmol/min to 90 μmol/min. Although it depends on condition of the base substrate such as the size, shape and arranging interval of the formed projection part, kind and direction of material supply, and conditions with respect to crystal growing process, the amount of material supply q is more preferably in a range from 10 μmol/min to 80 μmol/min. When this amount is too large, it becomes difficult to obtain approximately the maximum value of the difference (b−a), and forming a large cavity at each interval of the projection part (sidewall of the projection part) also becomes difficult. In this case, stress in a crystal which is generated by difference of lattice constants becomes comparatively difficult to be relaxed and dislocations occur. As a result, crystallinity of a single crystal in the substrate layer tends to be deteriorated, which is not desirable.

And, in a process of separating the base substrate and the substrate layer by using stress (shearing stress), when there is no cavity at sidewalls of the projection part or cavities formed there are too small, stress can hardly concentrate on the projection part and it hardly ruptures. That is not desirable.

And when amount of material supply q is too small, too much time is required for crystal growth, to thereby deteriorate productivity of the device. That is not preferable.

The sixth aspect is drawn to the method according to one of the first to fifth aspects, wherein silicon (Si) or silicon carbide (SiC) is used as a material of the base substrate.

Alternatively, GaN, AlN, GaAs, InP, CaP, MgO, ZnO, and $MgAl_2O_4$ and so on may be used to form the base substrate. Also alternatively, sapphire, spinel, manganese oxide, lithium gallium oxide ($LiGaO_2$), and molybdenum sulfur (MoS) may be used for the base substrate.

But when the base substrate and the substrate layer are separated by using shearing stress according to difference of thermal expansion coefficients, it is preferable to choose a combination of materials which do not decrease difference of thermal expansion coefficients of the materials. Also, a material which easily ruptures is preferably used for the base substrate side.

The seventh aspect is drawn to a method according to one of the first to sixth aspects, wherein Si (111) is used as a material of the base substrate and a projection part is formed so that Si (111) surface is not exposed at the exposed part of the base substrate, which is a valley part at an interval between each projection part, in the projection forming process.

By employing this method, crystal growth velocity 'a' of the exposed surface of the valley portion can be decreased. As a result, the difference (b−a) can be controlled to be approximately maximum value while crystallinity of the base substrate is maintained.

The eighth aspect is drawn to a method according to one of the first to the seventh aspects, further comprising a process for forming a buffer layer made of $Al_xGa_{1-x}N$ ($0<x\leq 1$) at least on the surface of the projection part after the projection part forming process.

Further, in addition to the buffer layer, a middle layer having approximately the same composition ratios as that of the buffer layer (e.g., AlN or AlGaN) may be deposited periodically, alternatively with other layer, or deposited so that the buffer layer compsises a multiple layer structure.

By depositing such a buffer layer (or a middle layer), stress which is generated by difference of lattice constants and acts to the substrate layer (grown layer) is relaxed by the same operation as the conventional one, to thereby enable to improve crystallinity.

The ninth aspect is drawn to a method according to the eighth aspect, wherein thickness of the buffer layer is the same or less than a height of the projection part in longitudinal direction. As an absolute standard, a thickness of the buffer layer is preferably in a range of 0.01 μm to 1 μm.

By employing this method, only a desired crystal layer (e.g., GaN layer) formed on the buffer layer can be grown in lateral direction to have high quality. Accordingly, stress caused by difference of lattice constants of the base substrate and the substrate layer which acts to the crystal layer growing on the buffer layer is decreased. As a result, dislocation concentration can be effectively decreased.

Generally, a material such as AlN or AlGaN which is employed to form a buffer layer tends to cover approximately entire surface of the exposed portion of the base substrate, and GaN tends to be grown in lateral direction rather than AlN and AlGaN. But the present method enables to form a larger cavity at the sidewall of the projection part more securely.

By employing this method, a large area of the crystal layer (a desired layer formed on the buffer layer) is exposed directly when the substrate layer is separated from the base substrate. As a result, decreasing electric resistance becomes easier when an electrode is formed at the back surface of the substrate layer.

Preferably, a thickness of the buffer layer is in a range of 0.01 μm to 1 μm. More preferably range is from 0.1 μm to 0.5 μm. If the buffer layer is too thick, cavities tend to become too small, which is not preferable. If the buffer layer is too thin, it becomes difficult to form the buffer layer uniformly. Especially when unevenness of the buffer layer (a portion on which a crystal layer is not formed sufficiently) is occurred around the upper portion of the projection part, crystallinity of the substrate layer tends to become ununiform. That is not preferable.

The tenth aspect is drawn to a crystal growing process according to one of the first to the ninth aspects, wherein a thickness of the substrate layer is 50 µm or more.

A thickness of the substrate layer (group III nitride compound semiconductor) on which a crystal layer is formed by crystal growth is preferably 50 µm or more. The thicker the substrate layer is, the more tensile stress toward the substrate layer is relaxed, and that can decrease generation of dislocations or cracks in the substrate layer. Further, that can strengthen the substrate layer at the same time, to thereby make it easier for shearing stress to concentrate on the projection part.

The eleventh aspect is drawn to a crystal growing process according to any one of the first to tenth aspects, wherein the crystal growth method is changed halfway from a slower crystal growth to a faster crystal growth.

For example, a crystal growth method (e.g. MOVPE) which may easily obtain approximately maximum value of the difference (b–a) is employed until the crystal growth surface becomes approximately a series of one plate, and then a crystal growth method (e.g. HVPE) which may easily obtain thickness of 50 µm or more is employed. As a result, a semiconductor crystal having excellent quality can be obtained in a short time.

The twelfth aspect is drawn to a projection forming process according to any one of the first to eleventh aspects, wherein each projection part is arranged at approximately constant interval or in approximately a constant period.

As a result, lateral growth condition becomes generally and approximately equal, and ununiformity of crystallinity hardly occurs. By the time when the upper portion of the valley part at each interval of the projection parts is completely covered by the substrate layer, local ununiformity hardly occurs. Because of that, it becomes easier to decide the time when to change the crystal growth method halfway from a slower crystal growth to a faster crystal growth exactly, early, and constantly.

Also, by employing the present method, each cavity may have approximately the same size, and that enables shearing stress to be distributed uniformly at each projection part. As a result, each projection part is uniformly broken and the base substrate and the substrate layer can be separated securely.

The thirteenth aspect is drawn to the projection forming process according to the twelfth aspect, wherein a projection part is formed on each lattice point of a two-dimensional triangle lattice which is based on an approximately equilateral triangle having a side in length of 0.1 µm or more.

By employing this process, the method of the twelfth aspect can be carried out more concretely, precisely and securely, to thereby securely decrease numbers of dislocations.

The fourteenth aspect is drawn to the projection forming process according to any one of the first to thirteenth aspects, wherein a shape of the horizontal section of each projection part is an approximately equilateral triangle, an approximately equilateral hexagon, an approximately circle and a quadrangle.

By employing this process, each crystal axis direction of a crystal made of group III nitride compound semiconductor becomes easily arranged in order, or a horizontal length (thickness) of the projection part along a certain horizontal direction can be approximately constant, to thereby decrease numbers of dislocations. Especially the sectional shape of each projection part is preferably an equilateral hexagon or an equilateral triangle because such a sectional shape tends to match the crystal structure of a semiconductor crystal.

Also, the sectional form may be a circle or a quadrangle because it is easy to be manufactured and is suitable to the general level of the present processing technology.

The fifteenth aspect is drawn to the projection forming process according to any one of the first to fourteenth aspects, wherein an arranging interval (arrangement period) between each projection part is in a range of 0.1 µm to 10 µm. More preferably, although it depends on a condition of crystal growth, arranging interval between each projection part may be in a range of 0.5 µm to 8 µm. Here arranging interval between each projection part is a distance from one central point of a projection part to another which is adjacent to each other.

By employing this process, the substrate layer can cover the upper portion of a valley part between each projection part and a cavity can be formed between each projection part.

When the arranging interval between each projection part is too narrow, action of ELO can hardly be obtained, and crystallinity of a crystal layer is deteriorated. Also, when the arranging interval is too narrow, cavities become too small and it becomes difficult to rupture the projection part unless a thickness of the substrate layer is enlarged beyond necessity.

When the arranging interval between each projection part is too wide, the upper portion of the valley part between each projection part cannot be covered securely, and a crystal (substrate layer) having uniform and excellent crystallinity cannot be obtained.

Also, when the arranging interval is too wide, the exposed portion of the valley part becomes too large, action of ELO can hardly be obtained and no cavity is formed. As a result, crystallinity is deteriorated and it becomes difficult to rupture the projection part unless thickness of the substrate layer is enlarged beyond necessity.

The sixteenth aspect drawn to the projection forming process according to any one of the first to fifteenth aspects, wherein height of the projection part in longitudinal direction is in a range of 0.5 µm to 20 µm. More preferably, although it depends on a condition of crystal growth, height of the projection part in longitudinal direction may be in a range of 0.8 µm to 5 µm.

When height of the projection part is too small, action of ELO can hardly be obtained as well as when there is no projection part, resulting in deteriorating the crystallinity of the growing crystal. Also when height is too small, cavities cannot be formed.

When height of the projection part is too large, the condition becomes not desirable: forming a projection part itself becomes difficult and takes time beyond necessity, and material used to form the base substrate is consumed beyond necessity. Also, when height is too large, shearing stress is scattered in longitudinal direction of the projection part, to thereby make it difficult to rupture the projection part securely.

The seventeenth aspect is drawn to the projection forming process according to any one of the first to sixteenth aspects, wherein thickness in lateral direction, width, or diameter of the projection part is in a range of 0.1 µm to 10 µm. More preferably, although it depends on a condition of crystal growth, thickness in lateral direction, width, or diameter of the projection part may be in a range of 0.5 µm to 5 µm.

When thickness of the projection part in lateral direction is too large, stress which acts to the substrate layer (grown layer) according to the difference of lattice constants becomes larger, and the number of dislocations of the substrate layer easily increases. When thickness of the projection part in lateral direction is too small, forming a projection part itself becomes difficult or crystal growth velocity b of the upper portion of the projection part becomes slower. That is not desirable.

Also, in a process of breaking the projection part by using stress (e.g. shearing stress), when thickness in lateral direction, width, or diameter of the projection part is too large, portions of the projection part which cannot be ruptured securely increase. That is not desirable.

Here stress which acts to the substrate layer (grown layer) generated by the difference of lattice constants does not depend on only thickness (length) of the projection part in lateral direction, but depends on an arranging interval between each projection part. If each range of the thickness (length) of the projection part and the arranging interval are inappropriate, stress which is generated by the difference of lattice constants becomes larger, and dislocations increase more easily in the substrate layer. That is not desirable.

Because each of thickness in lateral direction, width, and diameter around the upper portion of the projection part has its optimum value or appropriate range as mentioned above, the upper surface, the bottom surface, or the horizontal section is preferably in a shape which at least has a closed portion (island pattern) at least in a part. Preferably, the upper surface, the bottom surface, or the horizontal section of the projection part may be formed in a convex shape which is closed and is sticked out toward the outside. More preferably, it may be formed in a shape such as an approximately circle and an approximately equilateral triangle. By applying such conditions, the optimum value or the appropriate range as described above can be realized securely in a certain horizontal direction.

The eighteenth aspect is drawn to a method according to any one of the first to seventeenth aspects, further comprising the steps of at least one of various kind of etching, electron rays irradiation treatment, optical treatment such as irradiating laser, chemical treatment, and a physical treatment such as cutting and grinding before the crystal growing process. Then crystallinity or molecule structure of at least a portion of the exposed region in the valley part between each projection part formed in the base substrate is deteriorated, and crystal growth velocity 'a' of a group III nitride compound semiconductor in the exposed region becomes slower.

By employing this method, the difference of crystal growth velocities, or (b−a), can be enlarged. Accordingly, because this method can relatively enlarge crystal growth velocity around the upper portion of the projection part, stress caused by difference of lattice constants of the base substrate and the substrate layer is relaxed as described above and dislocations at growing the substrate layer and cracks are hardly generated is the substrate layer.

The nineteenth aspect is drawn to the separating process according to any one of the first to eighteenth aspects, wherein the substrate is cooled to approximately ambient temperature at a cooling rate of about −100° C./min to −0.5° C./min under condition that the substrate comprising the base substrate and the substrate layer is remained in the reaction chamber and ammonia ($NH_3$) gas is flown at an approximately constant flowing rate in the reaction chamber of a growth apparatus.

By employing such a method, for example, the separating process can be carried out while crystallinity of the substrate layer is kept excellent.

The twentieth aspect is drawn to a method of the first to nineteenth aspects, further comprising a removing process for removing remains of ruptured projection part remaining at the back surface of the substrate layer by using a chemical or physical treatment such as etching at least after the separating process.

When an electrode of a device such as a light-emitting semiconductor device is formed on the back surface of the substrate (the surface from which the base substrate is separated), ununiformity of electric current and electric resistance generated around an interface between the electrode and the substrate layer can be decreased by employing the process. That is resulting in decreasing driving voltage and improving luminous intensity.

And when the electrode is used as a reflector of a device such as a light-emitting semiconductor device, removing the remains of ruptured projection part enables to decrease absorption and scatter of light and improves reflectivity around the reflector. As a result, luminous intensity of the device increases.

When this removing process is carried out by using, for example, a physical treatment such as polishing, even the buffer layer formed on the back side of the substrate layer can be removed and flatness of the back surface of the substrate layer may be improved. As a result, the above-described effect such as suppressing ununiformity of electric current and electric resistivity and decreasing absorption and scatter of light around the reflector may be improved more.

The twenty-first aspect is drawn to a group III nitride compound semiconductor light-emitting device comprising a semiconductor crystal which is manufactured by using any one method of the first to twentieth aspects for producing a semiconductor crystal as a crystal growth substrate.

By employing this aspect, a group III nitride compound semiconductor light-emitting device can be produced or is produced easily by using a semiconductor which has excellent crystallinity and less inner stress.

The twenty-second aspect is drawn to a group III nitride compound semiconductor light-emitting device comprising a crystal growth substrate, which is manufactured by using the method for producing a semiconductor crystal according to any one of the first to twentieth aspects, as a crystal growth substrate, wherein the group III nitride compound semiconductor light-emitting device is grown on the substrate by crystal growth.

By employing this aspect, a group III nitride compound semiconductor light-emitting device can be manufactured easily by using a semiconductor which has excellent crystallinity and less inner stress.

Through employment of the aforementioned aspects of the present invention, the aforementioned drawbacks can be overcome.

The twenty-third aspect is drawn to a method for producing a semiconductor substrate in which a semiconductor crystal A comprising group III nitride compound semiconductor is grown on a base substrate made of silicon (Si) by using lateral crystal growth, comprising steps of: a reaction prevention process for forming a reaction prevention layer, which is made of a material B whose melting point is higher than that of the semiconductor crystal A, on the base substrate; a projection part forming process for forming numbers of projection parts from the reaction prevention layer by employing chemical or physical etching, without exposing the side of the base substrate on which the reaction prevention layer is formed; and a crystal growing process wherein at least a portion of the surface of the projection part is used as an initial growth surface on which crystal growth of the semiconductor crystal A starts first, and the semiconductor crystal A is formed by crystal growth until each growth surface is connected to become a series of an approximately flat surface.

Here, the semiconductor substrate comprising the semiconductor crystal A may have a single layer structure. Alternatively, it may also have a multiple layer structure.

As used herein, the term group III nitride compound semiconductor generally refers to a binary, ternary, or quaternary semiconductor having arbitrary compound crystal proportions and represented by $Al_xGa_yIn_{(1-x-y)}N$ ($0 \leq x \leq 1$, $0 \leq y \leq 1$, $0 \leq x+y \leq 1$). A semiconductor doped with p-type or n-type impurity is also included in a group III nitride compound semiconductor described in the present specification.

Group III elements (Al, Ga, In) may be partially replaced with boron (B) or thallium (Tl), and nitrogen (N) atoms may be completely or partially replaced with phosphorus (P), arsenic (As), antimony (Sb), or bismuth (Bi). Such a semiconductor may also be included in "a group III nitride compound semiconductor" in the present specification.

Examples of the aforementioned p-type impurity include magnesium (Mg) and calcium (Ca).

Examples of the aforementioned n-type impurity include silicon (Si), sulfur (S), selenium (Se), tellurium (Te), and germanium (Ge).

These impurities may be incorporated in combination of two or more species, and a p-type impurity and an n-type impurity may be incorporated in combination.

FIG. 5 illustrates a schematic cross-sectional view which explains a basic idea of a method for producing a semiconductor crystal in the present invention. A reaction prevention layer is formed to prevent Si from reacting with a gallium nitride group semiconductor. By forming a reaction prevention layer (monocrystalline material B) made of a material whose melting point or thermal stability is higher than that of a gallium nitride group semiconductor (semiconductor crystal A), e.g., SiC and AlN, on a base substrate (Si substrate), a reaction part described above is not formed around silicon interface when the gallium nitride group semiconductor (semiconductor crystal A) is grown by crystal growth for a long time.

By forming a lot of projection parts, the gallium nitride group semiconductor (semiconductor crystal A) also grows in lateral direction starting from a flat-top portion of the projection part. Then stress according to the difference of lattice constants of the reaction prevention layer and the gallium nitride group semiconductor crystal A hardly occurs, and the stress may be remarkably relaxed.

By forming a lot of projection parts, stress which acts to the reaction prevention layer is relaxed and hardly functions so as to form a crack on the reaction prevention layer in longitudinal direction. As a result, cracks which penetrate the reaction prevention layer in longitudinal direction are hardly generated. And because the base substrate (Si substrate) and the gallium nitride group semiconductor (semiconductor crystal A) can be completely interrupted by the reaction prevention layer having no cracks which penetrate in longitudinal direction, generation of the above-described reaction part can be prevented more securely.

By forming the projection part, for example, contact portion of the reaction prevention layer and the semiconductor substrate (that is, a desired semiconductor crystal layer A) is limited narrowly, distortion owing to difference of lattice constants of the reaction prevention layer and the semiconductor substrate hardly grows larger, and stress caused by the difference of lattice constants of the base substrate and the semiconductor substrate is relaxed. That enables to decrease unnecessary stress which acts to a growing semiconductor substrate when the semiconductor substrate (desired semiconductor crystal A) grows by crystal growth, to thereby reduce generation of dislocations and cracks.

Owing to the stress relaxing action described above, dislocations hardly occurs in the gallium nitride group semiconductor (semiconductor crystal A), and generation of cracks can be remarkably reduced.

According to those actions and their synergism, it becomes possible or easier to obtain a semiconductor substrate (semiconductor crystal A) of high quality whose dislocation concentration is sufficiently controlled and which does not have reaction part and cracks.

The buffer layer C in FIG. 5 may be inserted if necessary, and such a buffer layer may not be necessarily an essential component in order to carry out the present invention. That is, actions and effects of the present invention may be obtained properly or more than that even without a buffer layer.

The twenty-fourth aspect is drawn to a method of the twenty-third aspect, wherein the semiconductor crystal A comprises a group III nitride compound semiconductor having a composition of $Al_xGa_yIn_{(1-x-y)}N$ ($0 \leq x < 1$, $0 < y \leq 1$, $0 < x+y \leq 1$).

The twenty-fifth aspect is drawn to a method of the twenty-third or twenty-fourth aspect, wherein at least one of silicon carbide (SiC), aluminum nitride (AlN), and spinel ($MgAl_2O_4$) is used as monocrystalline material B forming the reaction prevention layer.

The twenty-sixth aspect is drawn to a method of the twenty-third or twenty-fourth aspect, wherein AlGaN, AlInN, or AlGaInN, in which aluminum composition ratio is at least 0.30 or more, is used as monocrystalline material B forming the reaction prevention layer. Further, a material which has a lattice constant of less than 3.18 Å, comparatively strong interatomic binding energy, high thermal stability (fusing point) and high stability may be preferably employed as monocrystalline material B.

The twenty-seventh aspect is drawn to a method according to any one of the twenty-third to twenty-sixth aspects, wherein a cavity in which the semiconductor crystal A is not deposited is formed at each interval of the projection parts by growing each growth surface in lateral direction and connecting it with each other.

Such a cavity is preferably formed as large as possible. But when it is too large, it becomes difficult to obtain an approximately plane growth surface after it is connected with each other. And when the cavity is too small, stress relaxation caused by lateral growth becomes smaller. So size of each cavity may be determined carefully.

The twenty-eighth aspect is drawn to a method according to any one of the twenty-third to twenty-seventh aspects, wherein thickness of the valley part of the reaction prevention layer between each projection parts is in a range of 0.1 μm to 2 μm.

When thickness of each reaction prevention layer at the valley part is too small, it cannot be formed even. And because the mono-crystalline material B is not a material with sufficient stability, gallium (Ga) or gallium nitride (GaN) and silicon (Si) cannot be completely interrupted. As a result, formation of reaction part (poly-crystalline GaN) may not be prevented sufficiently.

When thickness of each reaction prevention layer at the valley part is too large, cracks tends to be generated in the valley part of the reaction prevention layer, and gallium (Ga) or gallium nitride (GaN) and silicon (Si) cannot be completely interrupted. As a result, formation of reaction part may not be prevented sufficiently.

When thickness of each reaction prevention layer at the valley part is too large, more time and materials are needed to deposit the reaction prevention layer, to thereby unfavorably increase the production cost of the device.

The twenty-ninth aspect is drawn to the projection part forming process according to any one of the twenty-third to twenty-eighth aspects, wherein the projection part is formed to have longitudinal length of 0.5 µm to 20 µm. More preferably longitudinal length of the projection part may be in a range of 1 µm to 5 µm.

When the projection part is too low, a cavity becomes smaller and lateral growth of the semiconductor crystal A cannot be sufficient, to thereby provide insufficient stress relaxation action. That is not desirable. When the projection part is too high, more deposition time, etching time and materials are needed. That is not favorable to the production cost of the device.

The thirtieth aspect is drawn to the projection part formation profess according to any one of the twenty-third to twenty-ninth aspects, wherein the projection part is formed to have lateral length, width, or diameter of 0.1 µm to 10 µm. More preferably lateral length, width, or diameter of the projection part may be in a range of 0.5 µm to 5 µm, although it depends on conditions for carrying out crystal growth.

When the width of the projection part is too large, influence of the stress which affects the semiconductor substrate (grown layer) according to the difference of the lattice constants becomes larger, and the number of dislocations of the semiconductor substrate increases easily. When the width of the projection part is too small, the projection par itself is different to be formed and crystal growth velocity b of the upper portion of the projection part becomes small. That is not desirable.

The thirty-first aspect is drawn to a method according to any one of the twenty-third to thirtieth aspects, further comprising a separation process for separating the semiconductor crystal A and the base substrate, wherein stress owing to differences of thermal expansion coefficients is generated by cooling or heating the substrate crystal A and the base substrate, and the projection part is broken by using the stress.

For example, when a semiconductor substrate (semiconductor crystal A) made of a group III nitride compound semiconductor is grown on the base substrate having a lot of projection parts as shown in FIG. 5, a cavity on which the semiconductor crystal is not deposited can be formed at each interval (side) of the projection parts by controlling, e.g., size, interval, and crystal growth conditions of the projection parts. Accordingly, when the semiconductor substrate (semiconductor crystal A) is formed to have a sufficient thickness compared with height of the projection part, inner stress or outer stress becomes easy to act intensively to the projection parts. As a result, especially these stress function as shearing stress toward the projection parts. When the shearing stress becomes larger, the projection parts rupture.

Accordingly, the base substrate and the semiconductor substrate can be easily separated (exfoliated) by applying the stress. The larger the cavity is, the more easily stress (shearing stress) concentrates to the projection parts.

In short, according to the thirty-first aspect described above, the semiconductor crystal A and the base substrate can be easily separated because it becomes easy to generate stress.

When the base substrate and the semiconductor substrate are separated (exfoliated), a part of the semiconductor substrate may remain on the base substrate side, or a part of the base substrate (e.g., rupture remains of the projection part) may remain on the semiconductor substrate side. That is, this separation process does not necessarily require complete or perfect separation of each material with no remains.

Such rupture remains may be removed by using conventional methods such as wrapping and etching if necessary.

The thirty-second aspect is drawn to the crystal growing process according to any one of the twenty-third to thirty-first aspects, wherein the semiconductor crystal A is deposited to have a thickness of 50 µm or more.

The larger thickness of the semiconductor crystal A is, the more tensile stress to the semiconductor substrate (semiconductor crystal A) is relaxed. That decreases generation of dislocations and cracks in the semiconductor substrate and at the same time strengthen the semiconductor substrate. As a result, it becomes easier to concentrate the stress to the projection part.

Preferably, thickness of the base substrate (Si substrate) is 300 µm or less. The smaller this thickness is, the more the tensile stress to the semiconductor substrate (semiconductor crystal A) is relaxed. That results in decreasing generation of dislocations and cracks in the semiconductor substrate. But when thickness of the base substrate is less than 50 µm, a problem takes place in absolute strength of the base substrate itself, and high productivity of the device cannot be maintained. So in order to keep the quality and the productivity of the crystal growth substrate, the base substrate may preferably have thickness in a range of 50 µm to 300 µm.

Relatively, the semiconductor substrate (semiconductor crystal A) formed by crystal growth may preferably have thickness which is approximately equivalent to or more than that of the base substrate (Si substrate). By applying such conditions, tensile stress to the semiconductor substrate may be easily relaxed, to thereby decrease generation of dislocations and cracks in the semiconductor substrate remarkably compared with a conventional invention. The larger the relative thickness of the semiconductor substrate is, the more effect can be obtained.

The thirty-third aspect is drawn to the crystal growing process according to any one of the twenty-third to thirty-second aspects, wherein the value of (b–a), or crystal growth velocity 'b' of group III nitride compound semiconductor on the peak point of the projection part minus crystal growth velocity 'a' of group III nitride compound semiconductor on at least a portion of the etched region of each concave, which is each interval of the projection parts of the base substrate, is controlled to become approximately maximum by controlling supply amount q of raw material of a group III nitride compound semiconductor.

By employing this process, crystal growth velocity of the top portion of the projection part becomes relatively large, crystal growth around the eroded part is comparatively suppressed, and crystal growth starting around the top portion of the projection part becomes dominant. As a result, lateral growth of the semiconductor substrate (semiconductor crystal A) starting from the top portion of the projection part becomes remarkable, and stress caused by difference of lattice constants of the reaction prevention layer and the semiconductor substrate which acts to the semiconductor substrate in crystal growing process is relaxed. Thus crystal structure of the semiconductor substrate becomes stable and dislocations and cracks hardly occur in the semiconductor substrate.

And when epitaxial lateral overgrowth (ELO) of the semiconductor substrate becomes remarkable, for example, a comparatively large cavity tends to be formed at each side (each interval) of the projection part.

When ruggedness is formed at the surface of the base substrate in an appropriate size at an appropriate interval in an appropriate period, generally supply amount of crystal material per unit time and unit area tends to be smaller at the concave part (valley part) compared with the area around the upper surface of the convex part (projection part) except for the area around the peripheral sidewalls of the base substrate. That depends on flow rate, temperature, and direction of gas-flow of crystal materials. By controlling these conditions properly and optimally, the difference (b−a) may be controlled to be an approximately maximum value.

The thirty-fourth aspect is drawn to a method according to the thirty-third aspect, wherein raw material supply q is arranged in a range of 1 μmol/min to 100 μmol/min.

More preferably, raw material supply q may be in a range of 5 μmol/min to 90 μmol/min. Further preferably, although it depends on conditions of the base substrate such as size, shape and arranging interval of the projection part and conditions of crystal growth such as kinds and supplying direction of raw material, it may be around 10 μmol/min to 80 μmol/min. When the amount of raw material supply q is too large, it becomes difficult to control the difference (b−a) to be an approximately maximum value, and forming a large cavity at each interval (sidewall) of the projection part also becomes difficult. At that time stress generated in crystal according to a difference of lattice constants hardly relaxed and dislocations occur. That results in deteriorating crystallinity of a single crystal in the semiconductor substrate, which is not desirable.

And in a process of separating the base substrate and the semiconductor substrate by applying stress (shearing stress), stress is hardly concentrated to the projection part in case that there is no cavity at each sidewall of the projection part or that cavities existing there are too small. Then rupture of the projection part hardly occurs, which is not desirable.

On the contrary, when the amount of raw material supply q is too small, crystal growth takes too much time, which is not desirable for productivity of the device.

The thirty-fifth aspect is drawn to any one method of the twenty-third to thirty-fourth aspects, wherein a buffer layer C made of $Al_xGa_{1-x}N$ ($0<x\leq1$) is formed on at least the surface of the projection part after the projection part forming process.

Here the buffer layer C is a semiconductor layer made of AlN or AlGaN which grows at the temperature around 400° C. to 1100° C. Alternatively, aside from the buffer layer C, a middle layer (it may be called just "a buffer layer" hereinafter) having almost the same compositions as those of the buffer layer C (e.g., AlN and AlGaN) may be further formed in the semiconductor substrate (semiconductor crystal A) periodically, alternatively with other layers, or deposited so that the middle layer has a multiple layer structure.

By depositing such a buffer layer (or a middle layer), stress caused by difference of lattice constants and acting to the semiconductor crystal A may be relaxed by the same action principle as that of the conventional one. As a result, crystallinity of the device is improved.

Such action and effect may be seen remarkable especially when the monocrystalline material B constructing the reaction prevention layer is such as silicon carbide (SiC).

The thirty-sixth aspect is drawn to a method according to the thirty-fifth aspect, wherein the buffer layer is formed to have thickness of 0.01 μm to 1μm.

By employing this method, only a desired semiconductor crystal A (e.g. GaN layer) can be grown in lateral direction in excellent condition.

As described above, the range about 0.01 μm to 1 μm, may be suitable and preferable thickness of the buffer layer. More preferably, thickness of the buffer layer may be in a range of 0.1 μm to 0.5 μm. When the buffer layer is too thick, cavities become too small and that is not desirable. When the buffer layer is too thin, it becomes difficult to form the buffer layer to have almost uniform thickness. Especially when the buffer layer has ununiformity (a portion where it is not grown properly) around the upper portion of the projection part, crystallinity of the buffer layer tends to be ununiform, and that is not desirable.

The thirty-seventh aspect is drawn to the projection part forming process of a method according to any one of the twenty-third to thirty-sixth aspects, wherein the projection part is arranged at an approximately equal interval or in an approximately equal period.

By employing this process, lateral growth condition becomes uniform at the entire part of the layer, and crystallinity of the buffer layer may hardly be ununiform.

Also, because each cavity is formed in an approximately equal size according to this method and shearing stress can be distributed to each projection part almost uniformly, all the projection parts may be ruptured evenly and the base substrate and the semiconductor substrate can be separated securely.

Because the time interval until the semiconductor substrate completely covers the upper portion of the valley part existing between each interval of the projection parts is hardly to be locally ununiform, time for changing crystal growth methods from the one whose crystal growth velocity is slower to the faster one, for example, can be determined exactly, early, and uniquely.

The thirty-eighth aspect is drawn to the projection part forming process according to the thirty-seventh aspect, wherein the projection part is formed on a lattice point of a two-dimensional triangle lattice which is based on an approximately equilateral triangle having a side in length of 0.1 μm or more.

By applying this process, the fifteenth aspect can be carried out more concretely, precisely and securely. As a result, numbers of dislocations can be securely decreased.

The thirty-ninth aspect is drawn to the projection part forming process according to any one of the twenty-third to thirty-eighth aspect, wherein the shape of the horizontal section of the projection part is an approximately equilateral triangle, an approximately equilateral hexagon, an approximate circle, an approximate rectangle, an approximate rhombus and an approximate parallelogram.

By employing this process, each crystal axis direction of a crystal made of a group III nitride compound semiconductor becomes easily arranged in order, or a horizontal length (width) of the projection part toward a certain horizontal direction can be approximately constant, to thereby control the number of dislocations. Especially the sectional shape of the projection part is preferably an equilateral hexagon, an equilateral triangle or an equilateral parallelogram because such a sectional shape tends to match the crystal structure of a semiconductor crystal. Also, the sectional shape may be a circle or a rectangle because it is easy to manufacture and suitable to the general level of the present processing technology.

The fortieth aspect is drawn to the projection part forming process according to any one of the twenty-third to thirty-ninth aspects, wherein each projection part is arranged at an interval of 0.1 μm to 10 μm. More preferably, arranging interval of each projection part may be about 0.5 μm to 8 μm although it depends upon conditions for carrying out crystal growth. Here arranging interval of each projection part represents a distance between middle points of each two projection parts which are close to each other.

By employing this process, the upper portion of the valley part of the desired semiconductor substrate (semiconductor crystal A) can be covered and at the same time a cavity can be obtained between each projection part (valley part of the projection part).

When arranging interval of each projection part is too narrow, effect which may be obtained by employing ELO method can hardly be expected, to thereby deteriorate crystallinity of the grown crystal. At that case cavities becomes too small, and the projection parts can hardly be ruptured unless the semiconductor substrate is formed to have unnecessarily large thickness.

When arranging interval of each projection part is too wide, the upper portion of the valley parts of the projection parts cannot be covered securely by the semiconductor substrate, and that prevents from supplying a semiconductor substrate (semiconductor crystal A) having uniform crystallinity and excellent quality.

When arranging interval of each projection part is too wide, the exposed portion of the valley part becomes too large and the effect which may be obtained by employing ELO method can hardly be expected. As a result, no cavity is formed.

The forty-first aspect is drawn to the reaction prevention process according to any one of the twenty-third to fortieth aspects, wherein the reaction prevention layers are formed on the surface and the back surface of the base substrate.

By employing this process, curving (distortion) of the base substrate (Si substrate) which may occur after the reaction prevention process can be prevented or relaxed.

The forty-second aspect is drawn to a group III nitride compound semiconductor device comprising the semiconductor crystal which is formed by the method of any one of the twenty-third to forty-first aspects as a crystal growth substrate.

Accordingly, a group III nitride compound semiconductor device made of a semiconductor which has excellent crystallinity and less inner stress can be obtained or easily produced.

The forty-third aspect is to form a group III nitride compound semiconductor device by employing crystal growth in which a semiconductor crystal manufactured by the method of any one of the twenty-third to forty-first aspects functions as a crystal growth substrate.

As a result, a group III nitride compound semiconductor device made of a semiconductor which has excellent crystallinity and less inner stress can be obtained or easily manufactured.

The forty-fourth aspect is drawn to a method for producing a free-standing semiconductor crystal A having excellent quality and independent from a base substrate on which a semiconductor crystal comprising a group III nitride compound semiconductor is grown, comprising the steps of: seed depositing process in which a seed layer having single layer structure or multiple layer structure and comprising a group III nitride compound semiconductor is deposited on the base substrate; erosion remains part forming process in which a portion of the base substrate on which the seed layer is deposited is eroded by chemical or physical treatment so that a seed layer remains on the base substrate partially or in scattered manner; crystal growing process in which the exposed portions of the erosion remains parts of the seed layer served as the initial crystal growth fronts from which the semiconductor crystal A starts to grow by crystal growth and each crystal growth front is connected with each other until it becomes at least a series of approximately flat surface; and separation process for separating the semiconductor crystal A and the base substrate by breaking the erosion remains parts.

Here a group III nitride compound semiconductor generally includes a binary, ternary, or quaternary semiconductor represented by a formula $Al_{1-x-y}Ga_yIn_xN$ ($0 \leq x \leq 1$, $0 \leq y \leq 1$, $0 \leq 1-x-y \leq 1$) and having an arbitrary composition ratio. And a group III nitride compound semiconductor in the present specification further includes a semiconductor doped with p-type or n-type impurity.

Alternatively, a semiconductor whose portion of the group III elements (Al, Ga, In) may be replaced with boron (B) or thallium (Tl), and a portion of nitrogen (N) may be replaced with phosphorous (P), arsenic (As), antimony (Sb), or bismuth (Bi) is also included in a group III nitride compound semiconductor of the present specification.

Examples of the p-type dopant which can be added include magnesium (Mg) and calcium (Ca).

Examples of the n-type dopant which can be added include silicon (Si), sulfur (S), selenium (Se), tellurium (Te), and germanium (Ge).

These dopants may be used in combination of two or more species, and a p-type dopant and an n-type dopant may be added simultaneously.

Alternatively, the base substrate may be made of sapphire, spinel, manganese oxide, lithium gallium oxide ($LiGaO_2$), molybdenum sulfide (MoS), silicon (Si), carbon silicide (SiC), AlN, GaAs, InP, GaP, MgO, ZnO, or $MgAl_2O_4$. In short, a well-known or arbitrary crystal growth substrate which is useful for crystal growth of a group III nitride compound semiconductor may be used as materials to form the base substrate.

More preferably, sapphire may be selected as a material to form the base substrate because of its reaction to GaN, difference of thermal expansion coefficient and stability at high temperature.

When an objective semiconductor crystal A comprising a group III nitride compound semiconductor is grown on the base substrate having a lot of erosion remains parts, the base substrate and the semiconductor crystal A are connected by only the erosion remains part. Because of that, when thickness of the semiconductor crystal A is sufficiently large, inner stress or outer stress tends to act intensively to this erosion remains part. As a result, especially inner stress and outer stress function as shearing stress to the erosion remains part, and the erosion remains part is ruptured when such stress becomes larger.

That is, separating (exfoliating) the base substrate and the semiconductor crystal A becomes easier by applying stress according to the above-described method of the present invention. Then a free-standing single crystal (semiconductor crystal A) which is independent from the base substrate may be obtained.

Forming the erosion remains part limits contact part of the base substrate and the semiconductor crystal A narrower and distortion owing to difference of lattice constants of the base substrate and the semiconductor crystal A is hardly generated. As a result, stress caused by difference of lattice constants of the base substrate and the semiconductor crystal A is relaxed. That controls unnecessary stress which acts to the desired semiconductor crystal A in crystal growing process and reduces generation of dislocations and cracks.

Here "a lot of erosion remains parts" may be, for example, "a lot" as far as it is seen from the vertical section as in FIGS. 9A–9D, and it may be connected with each other to be one plane. Accordingly, when the surface of the striped shape (the erosion remains part) is formed to be a series of one-dimensional rectangle wave form, sharp sin wave form or spiral form, the same action and effect as in the present invention may be obtained.

In the present invention, the erosion remains part is formed in a striped pattern. Alternatively, it may be formed in an island pattern of an approximately circle, approximately oval, approximately polygon or approximately equilateral polygon on a horizontal plane in order to obtain the same action and effect as in the present invention.

Alternatively, when the base substrate and the semiconductor crystal A are separated (exfoliated), a portion of the semiconductor crystal A may remain on the base substrate side, and also a portion of the base substrate (e.g., ruptured remains of the erosion remains part) may remain on the semiconductor crystal A side. In short, this separation process does not necessarily require complete separation of each material with no remains.

The forty-fifth aspect is drawn to the crystal growing process of the forty-fourth aspect, wherein the semiconductor crystal A is formed to have thickness of 50 μm or more. Thickness of the semiconductor crystal A is preferably 50 μm or more. The thicker the semiconductor crystal A is, the stronger crystallinity of the semiconductor crystal A becomes and the easier the shearing stress can be concentrated to the erosion remains part.

Because of that, exfoliation may take place according to difference of lattice constants even at high temperature in a process of crystal growth. And after the exfoliation the stress owing to difference of thermal expansion coefficients hardly acts to the semiconductor crystal A. As a result, dislocations and cracks never take place, to thereby obtain a high quality semiconductor crystal A (e.g., GaN single crystal).

The forty-sixth aspect is drawn to the method according to the forty-fourth and forty-fifth aspect, wherein stress owing to difference of thermal expansion coefficients is generated by cooling or heating the semiconductor crystal A and the base substrate and the erosion remains part is broken by using this stress.

In short, that rupture (exfoliation) may be caused by stress (shearing stress) according to difference of thermal expansion coefficients of the semiconductor crystal A and the base substrate.

According to this method, especially when the semiconductor crystal A is formed to have thickness of 50 μm or more, the semiconductor crystal A and the base substrate can be ruptured securely while crystallinity of the semiconductor crystal A is kept excellent.

The forty-seventh aspect is drawn to the method according to any one of the forty-fourth to forty-sixth aspects, wherein at least one of the seed layer and the uppermost layer of the seed layer is made of gallium nitride (GaN). As a composition of the semiconductor crystal A, gallium nitride (GaN) is the most optimum and very useful to form a crystal growth substrate of a semiconductor and is considered to have the highest industrial utility. Accordingly, by forming the seed layer or the uppermost layer of the seed layer with gallium nitride (GaN), crystal growth of an objective semiconductor crystal A (GaN single crystal) may be carried out most favorably.

AlGaN and AlGaInN also have high industrial utility. So they may be alternatively used as compositions of the semiconductor crystal A. When those materials are used, it may also be preferable to use a semiconductor (group III nitride compound semiconductor) having comparatively close compositions as those of the objective single crystal (semiconductor crystal layer A) to form at least one of the seed layer and the uppermost layer of the seed layer.

The forty-eighth aspect is drawn to the method according to any one of the forty-fourth to forty-seventh aspects, wherein at least one of the seed layer and the bottom layer of the seed layer is formed by using aluminum nitride (AlN).

Because a buffer layer may be formed by aluminum nitride (AlN), well-known and conventional effects for depositing the buffer layer (AlN) can be provided to the buffer layer. In short, the well-known effect such as relaxing stress which owes to difference of lattice constants and acts to the objective semiconductor crystal layer A by the buffer layer enables it easier to improve crystallinity of the semiconductor crystal layer A.

According to this method, the stress between the AlN buffer layer and the base substrate can be enlarged and the base substrate can be separated more easily.

Further, in order to obtain the effect sufficiently, the seed layer is, for example, formed to have two layer structure in which the lower layer is an AlN buffer layer (first seed layer) and the upper layer is a GaN layer (second seed layer). Such a seed layer having multiple layer structure is very effective. Accordingly, actions and effects according to both the fourth and fifth aspects described above may be obtained.

The forty-ninth aspect is drawn to the method according to any one of the forty-fourth to forty-eighth aspects, wherein each erosion remains part is arranged at an interval of 1 μm to 50 μm in the erosion remains part forming process. More preferably, arranging interval of each erosion remains part may be about 5 μm to 30 μm although it depends upon conditions for carrying out crystal growth. Here arranging interval of each erosion remains part represents a distance between middle points of each two erosion remains parts which are close to each other.

By employing that, the upper portion of the valley part between each erosion remains part can be covered by the semiconductor crystal A.

When the arranging interval between each erosion remains part is too wide, the upper portion of the valley part between each erosion remains part cannot be covered by the semiconductor crystal A securely, and a crystal (semiconductor crystal A) having uniform and excellent crystallinity cannot be obtained.

Also, when the arranging interval is too wide, deviation of crystal axis direction becomes remarkable, and that is not desirable.

When thickness in lateral direction, a width, or a diameter of the top portion of the erosion remains part is represented by S and the arranging interval (arrangement period) is represented by L, S/L may preferably be about ¼. By applying that condition, lateral epitaxial overgrowth (ELO) of the desired semiconductor crystal A can be adequately promoted and a single crystal having high quality may be obtained.

The distance between sidewalls of the erosion remains part facing with each other is represented by W(=L−S) and the region between each sidewall (in short, each concave and each upper portion of the etched part) may be called a wing hereinafter. Also, the width S may be called a seed width hereinafter. Accordingly, ratio of the seed width toward a wing, or S/W, is preferably about ⅓.

More preferably, erosion treatment may be carried out so that each erosion remains part is arranged at approximately a constant interval or in approximately a constant period.

As a result, growth condition of lateral growth becomes generally and approximately uniform, and ununiformity of crystallinity and thickness hardly occurs. The time until the upper portion of the valley part, or the interval between each erosion remains part, is completely covered by the semiconductor crystal A, hardly have local ununiformity. Because of that, it becomes easier to decide the time when to change the crystal growth method halfway from a slower crystal growth to a faster crystal growth exactly, early, and constantly.

Also, because the present method enables to distribute shearing stress uniformly at each erosion remains part, each erosion remains part ruptures uniformly and separation of the base substrate and the semiconductor can be carried out securely.

Accordingly, the erosion remains part may be, for example, formed in a striped pattern of mesa shape and arranged in a constant interval to the same direction. In forming such an erosion remains part, there may be an advantage that general etching in the present treatment technology level can be carried out easily and securely. At this time, direction of mesa (erosion remains part) may be <1–100> or <11–20> direction of the semiconductor crystal.

Also, it is useful to employ the process of forming the erosion remains part on a lattice point of a two-dimensional triangle lattice which is based on an approximately equilateral triangle having a side in length of 0.1 µm or more. By employing this process, the area contacting to the base substrate can be smaller. That enables to decrease numbers of dislocations securely and separate the base substrate more easily.

It is also useful to form a horizontal section of the erosion remains part to be an approximately equilateral triangle, an approximate equilateral hexagon, an approximate circle and an approximate rectangle.

By employing this process, each crystal axis direction of a crystal made of group III nitride compound semiconductor becomes easy to be arranged in order in all area, or a horizontal length (width) of the erosion remains part toward a certain horizontal direction can be approximately constant, to thereby decrease numbers of dislocations. Especially the sectional form of the erosion remains part is preferably an equilateral hexagon or an equilateral triangle because such a sectional form tends to match the crystal structure of a semiconductor crystal. Also, the sectional form may be a circle or a quadrangle because it is easy to manufacture and suitable to the general level of the present processing technology.

The fiftieth aspect of the present invention is to erode (etch) the base substrate to a depth of 0.01 µm or more. According to the erosion treatment (e.g., etching treatment), eroding a portion of the base substrate makes it easier to form even surface (crystal growth surface) of the objective semiconductor crystal A and further makes it easier to form cavities at each sidewall of the erosion remains part. The larger the cavities are,. the more stress (shearing stress) tends to concentrate to the erosion remains part.

The fifty-first aspect is drawn to the erosion remains part forming process according to any one of the forty-fourth to fiftieth aspects, wherein thickness in lateral direction, width, or diameter of the projection part is in a range of 0.1 µm to 20 µm. More preferably, although it depends on a condition of crystal growth, thickness in lateral direction, width, or diameter of the erosion remains part may be in a range of 0.5 µm to 10 µm. When thickness of the erosion remains part in lateral direction is too large, stress which acts to the semiconductor crystal A according to the difference of lattice constants becomes larger, and the number of dislocations of the semiconductor crystal A becomes easy to increase. When thickness of the erosion remains part in lateral direction is too small, forming a erosion remains part itself becomes difficult or crystal growth velocity b on the upper portion of the erosion remains part becomes slower. That is not desirable.

Also in a process of breaking the erosion remains part by using stress (e.g. shearing stress), when thickness in lateral direction, width, or diameter of the erosion remains part is too large, the area contacting to the base substrate becomes larger and portions of the erosion remains part which cannot be ruptured securely tend to increase. That is not desirable.

Here magnitude of affection of stress which acts to the semiconductor crystal A and is generated by the difference of lattice constants does not only depend on thickness (length) of the erosion remains part in lateral direction, but depends on an arranging interval between each erosion remains part. If each range of the thickness (length) of the erosion remains part and the arranging interval is inappropriate, stress which is generated by the difference of lattice constants becomes larger, and dislocations occur more easily in the semiconductor crystal A. That is not desirable.

Because each thickness in lateral direction, width, and diameter around the upper portion of the erosion remains part has its optimum value or appropriate range as mentioned above, the upper surface, the bottom surface, or the horizontal section are preferably in a shape which has a closed portion (island pattern) at least in a part. Preferably, the upper surface, the bottom surface, or the horizontal section of the erosion remains part may be formed in a convex shape which is closed to stick out toward the outside. More preferably, it may be formed in a shape such as an approximately circle and an approximately equilateral triangle. By applying such conditions, the optimum value or the appropriate range described above can be realized securely in a certain horizontal direction.

The fifty-second aspect is drawn to the crystal growing process according to any one of the forty-fourth to fifty-first aspects, wherein the crystal growth method is changed halfway from a slower crystal growth to a faster crystal growth.

By changing crystal growth method halfway from the growing method in which lateral growth is faster to the growing method in which vertical growth is faster, for example, a semiconductor crystal A having excellent crystallinity may be obtained in a shorter time.

The fifty-third aspect is drawn to the method of any one of the forty-fourth to fifty-second aspects, further comprising the step of a remains removing process at least after the separation process wherein the rupture remains of the erosion remains part left on the back surface of the semiconductor crystal A is removed by chemical or physical treatment such as etching.

When an electrode of a device such as a light-emitting semiconductor device is formed on the back surface of the semiconductor crystal A (the surface from which the base substrate is separated), ununiformity of electric current and electric resistance is generated around an interface between the electrode and the semiconductor crystal A. By employing the process, such ununiformity of electric current and electric resistance can be suppressed, resulting in decreasing driving voltage and improving luminous intensity.

And when the electrode is used as a reflector of a device such as a light-emitting semiconductor device, removing the rupture remains of erosion remains part decreases absorption and scatter of light and improves reflectivity around the reflector. As a result, luminous intensity of the device increases.

When this removing process is carried out by using, for example, a physical treatment such as polishing, even the buffer layer formed on the back surface of the semiconductor crystal A can be removed and flatness of the back surface of the semiconductor crystal A can be improved. As a result, the above-described effect such as decreasing ununiformity of electric current and electric resistivity and decreasing absorption and scatter of light around the reflector are improved more.

Alternatively, the above treatment process may be heat treatment. When sublimation temperature of the region to be removed is lower than that of the semiconductor crystal A, unnecessary portions of the remains part may be removed by employing heating process or laser irradiation.

The fifty-fourth aspect is drawn to a group III nitride compound semiconductor light-emitting device comprising a semiconductor crystal which is manufactured by a method according to any one of the forty-fourth to fifty-third aspects, wherein the semiconductor crystal functions as a crystal growth substrate.

By employing that, producing a group III nitride compound semiconductor light-emitting device made of a semiconductor which has an excellent crystallinity and little inner stress may become easier.

The fifty-fifth aspect is drawn to produce a group III nitride compound semiconductor light-emitting device being produced by a crystal growth on a crystal growth substrate which is produced by a method according to any one of the forty-fourth to fifty-third aspects as a crystal growth substrate.

By employing that, producing a group III nitride compound semiconductor light-emitting device made of a semiconductor which has an excellent crystallinity and little inner stress may become easier.

When the seed layer has multiple layer structure, a buffer layer made of $Al_xGa_{1-x}N$ ($0 \leqq x<1$) is preferably formed as the first layer to be deposited in the seed layer.

Further, in addition to the buffer layer, a middle layer having approximately the same composition (e.g., AlN, AlGaN) may be formed periodically, alternatively with other layers, or deposited to form a multiple layer structure.

By depositing such a buffer layer (or a middle layer), stress caused by difference of lattice constants and acting to the semiconductor crystal A may be relaxed by the same action principle as the conventional one, to thereby improve crystallinity of the device.

Alternatively, in the separation process, in order to decrease a temperature of the base substrate and the substrate crystal A, they may be preferably left in a reaction chamber of a growth apparatus and cooled to approximately ambient temperature at a cooling rate of about −100° C./min to −0.5° C./min under condition that ammonia ($NH_3$) gas is flown at an approximately constant flowing rate. As a result, the separation process may be carried out by keeping crystallinity of the semiconductor crystal A stable and excellent.

Through employment of the aforementioned aspects of the present invention, the aforementioned drawbacks can be overcome effectively and rationally.

BRIEF DESCRIPTION OF THE DRAWINGS

FIGS. 9A–9D are schematic sectional views showing a method for producing a semiconductor crystal according to a third embodiment of the present invention.

BEST MODE FOR CARRYING OUT THE INVENTION

Embodiments of the present invention will next be described with reference to the drawings. Characteristic features of the present invention which have been described above is also the best mode for carrying out the invention, and the present invention is not limited to the below-described specific embodiments.

In the following Example, a method for producing a semiconductor crystal (crystal growth substrate) according to a first embodiment of the present invention will be described. Here the first embodiment corresponds to the first to the twenty-second aspects described above.

First Embodiment

[1] Projection part forming process

Figure 1:
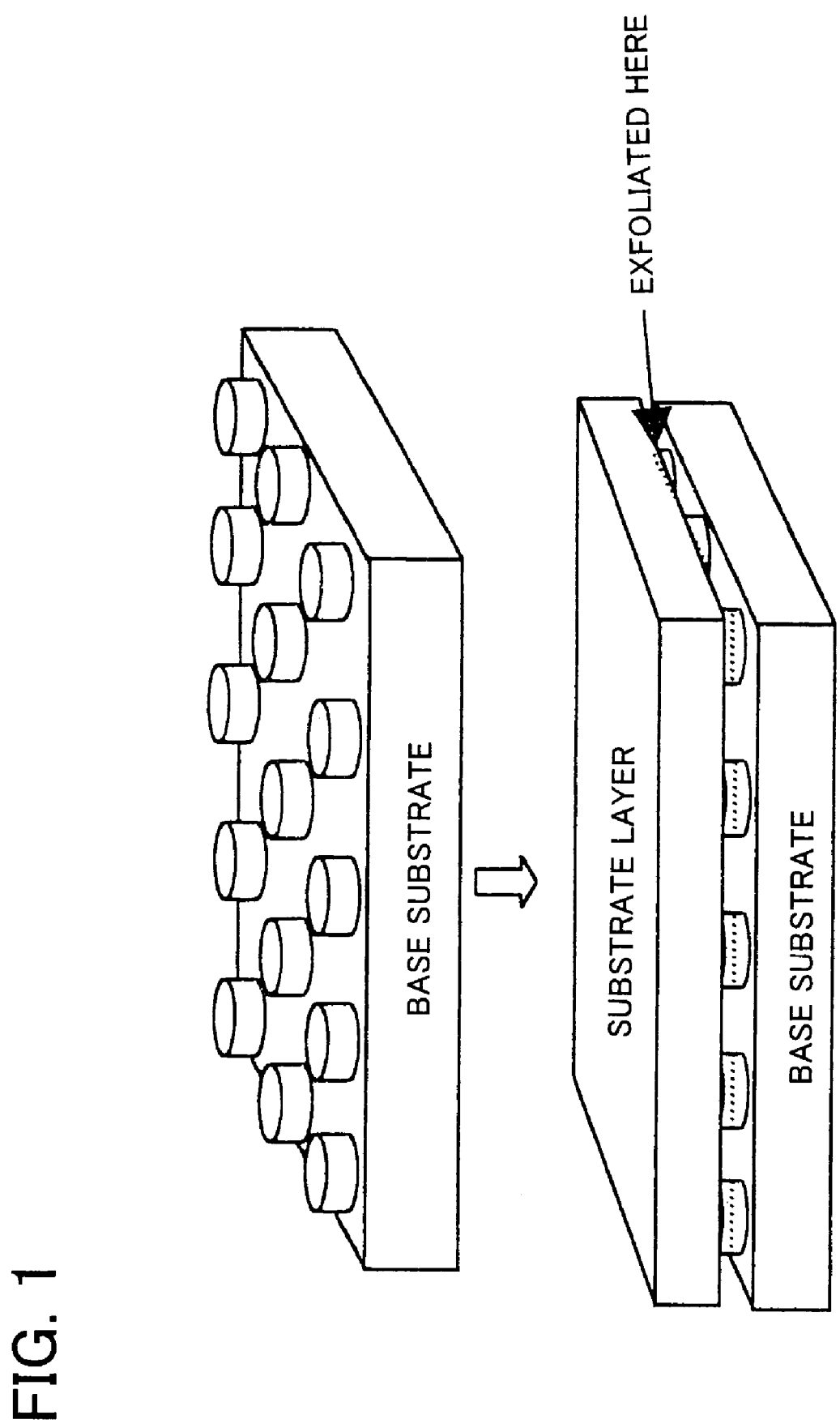
FIG. 1 is a schematic perspective view of a part of a base substrate having projection parts and a semiconductor crystal which grows thereon.
Figure 2A:
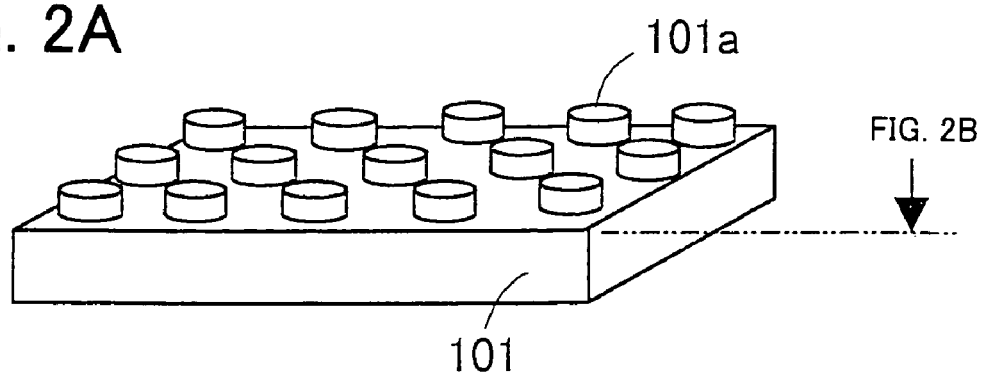
FIGS. 2A–2C are schematic perspective view, plan view, and sectional view of a base substrate (Si substrate) 101 according to the first embodiment of the present invention.
Figure 2B:
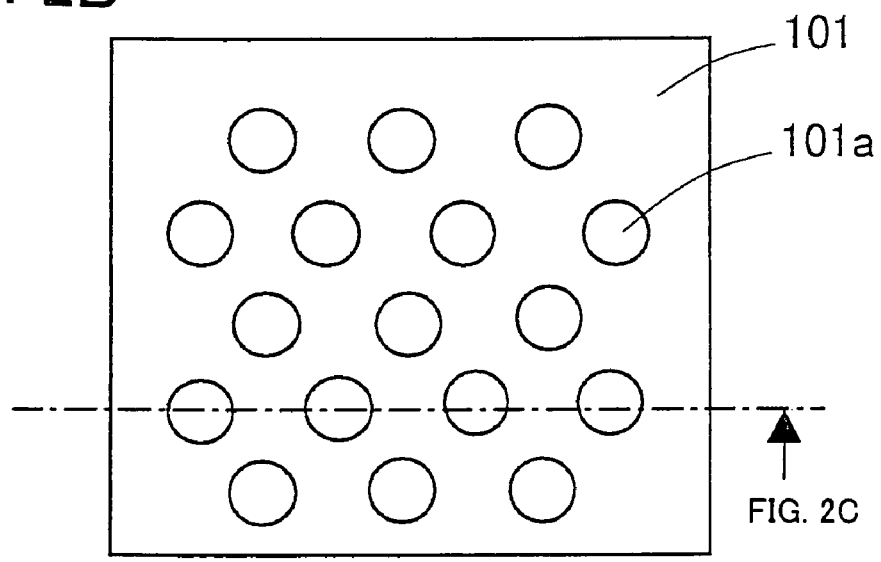
Figure 2C:
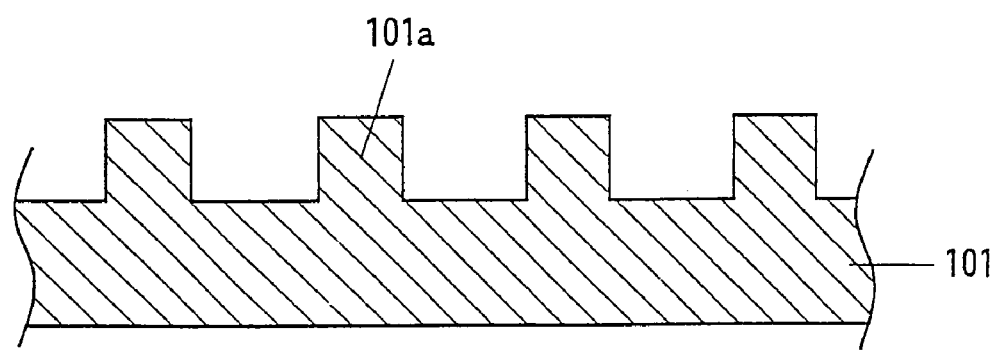

As shown in FIGS. 2A–2C, projection parts 101a each having diameter of approximately 1 µm and height of approximately 1 µm are formed in an approximately columnar shape on a Si (111) plane of a base substrate 101 made of Si single crystal at an interval of about 2 µm through dry-etching using photolithography. Each of the projection part 101a is arranged so that the center of the columnar bottom is placed at each lattice point of a two-dimensional triangle lattice based on an approximately equilateral triangle whose edge is about 2 µm. Here a thickness of the base substrate 101 is about 200 µm.

[2] Crystal growing process

Figure 4A:
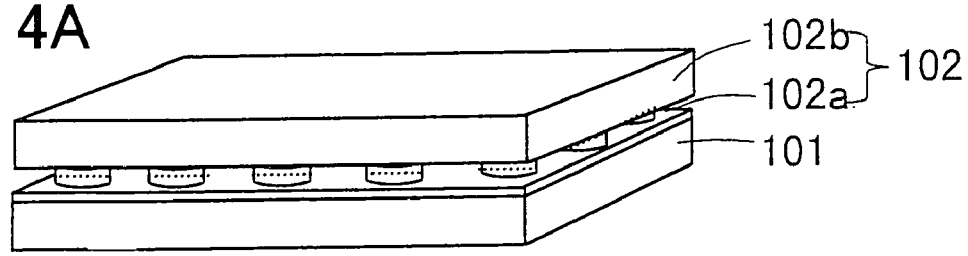
FIGS. 4A–4C are schematic perspective view, plan view, and sectional view of a base substrate 101 on which a substrate layer 102 (comprising a layer 102a and a layer 102b) is formed.
Figure 4B:
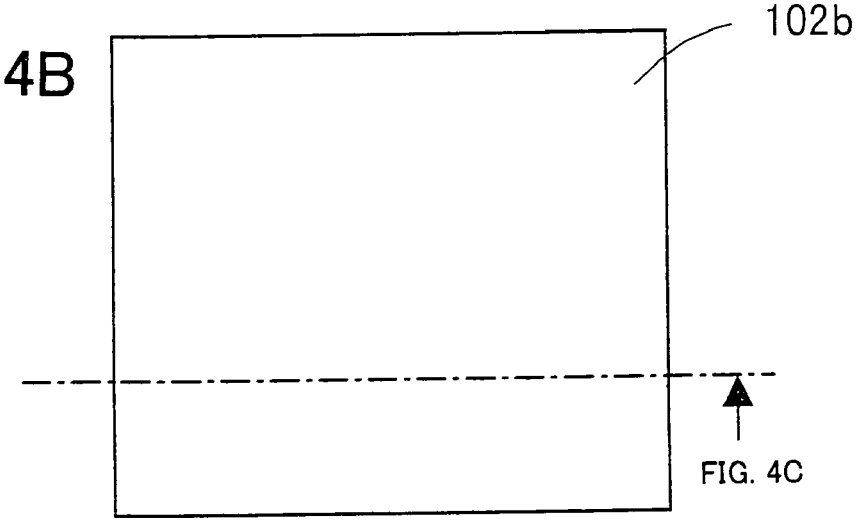
Figure 4C:
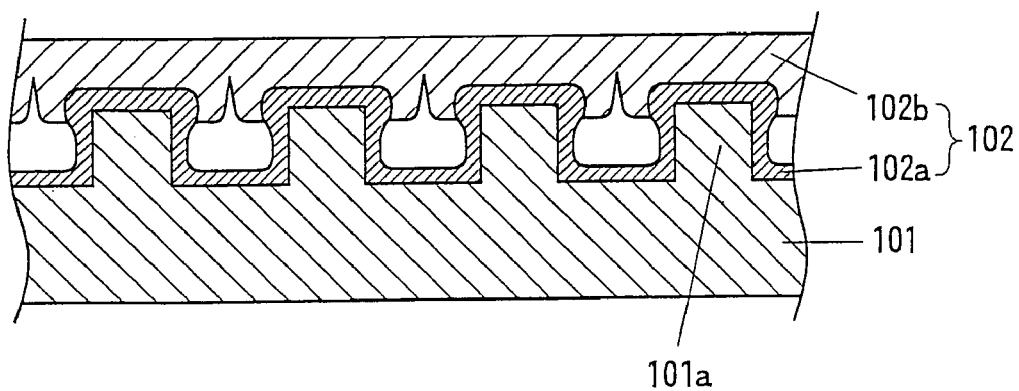
Figure 5:
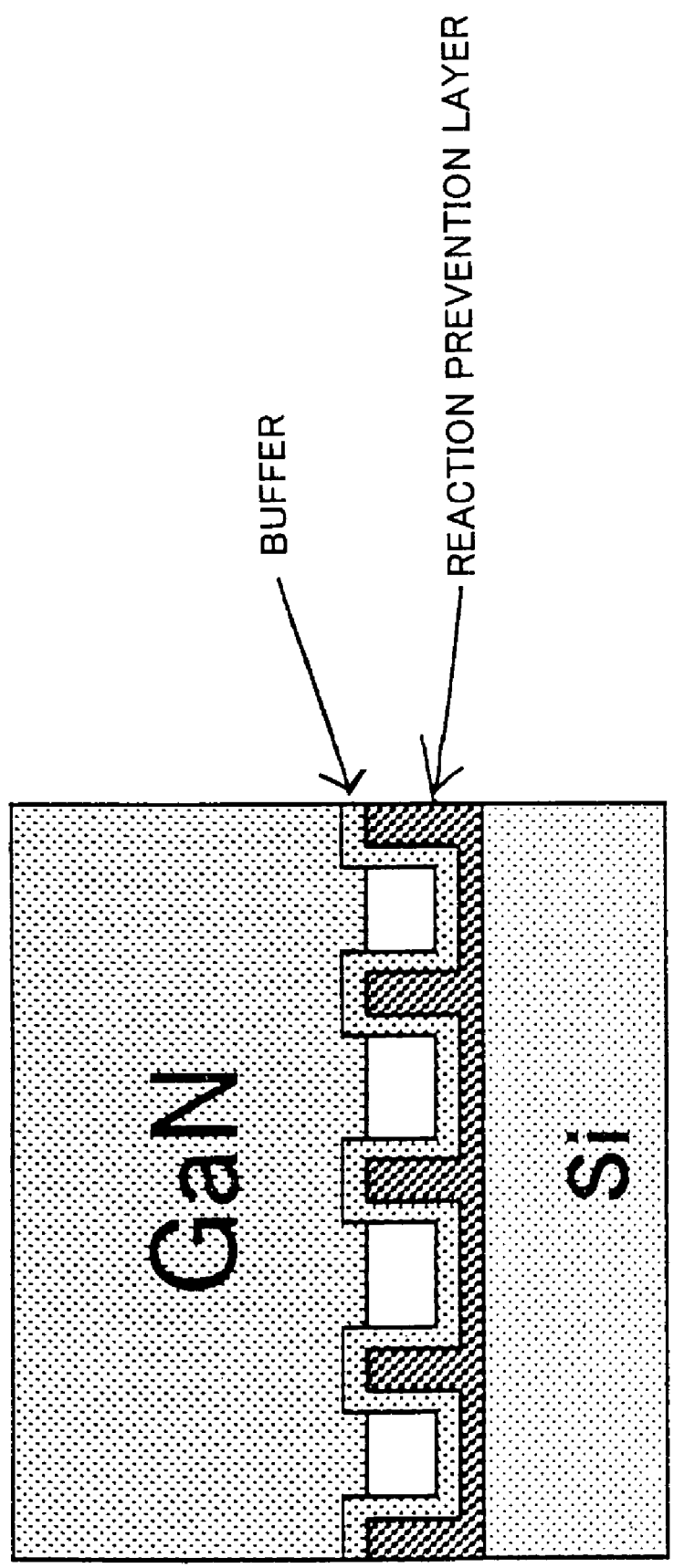
FIG. 5 is a schematic sectional view showing a method for producing a semiconductor crystal according to the present invention.

In the crystal growing process, the upper surface of the projection part 101a (at an initial state) is connected with each other to be a series of an approximately plane growth surface of a crystal as shown in FIGS. 4A–4C through metal-organic vapor phase epitaxy (hereinafter called "MOVPE"). After that the substrate layer (crystal layer) is grown to have thickness of about 200 μm through halide vapor phase growth (HVPE).

In this process, the following gasses were employed: ammonia ($NH_3$), carrier gas ($H_2$ or $N_2$), trimethylgallium ($Ga(CH_3)_3$, hereinafter called "TMG"), and trimethylaluminum ($Al(CH_3)_3$, hereinafter called "TMA").

(a) The base substrate 101 on which projection parts 101a are formed (shown in FIGS. 2A–2C) was placed on a susceptor in a reaction chamber for the MOVPE treatment after it has been cleaned by an organic washing solvent and acid treatment. Then the base substrate 101 was baked at 1100° C. in $H_2$ vapor fed into the chamber under normal pressure.

Figure 3A:
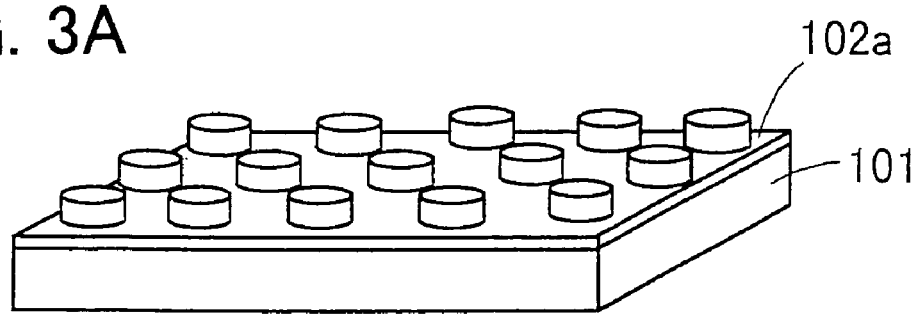
FIGS. 3A–3C are schematic perspective view, plan view, and sectional view of a base substrate 101 on which a first substrate layer (AlGaN buffer layer) 102a is formed.
Figure 3B:
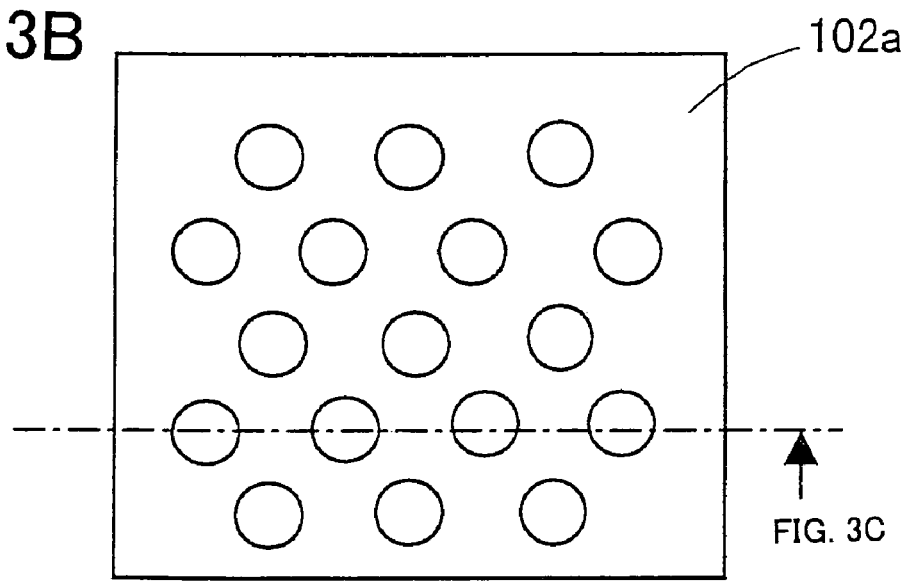
Figure 3C:
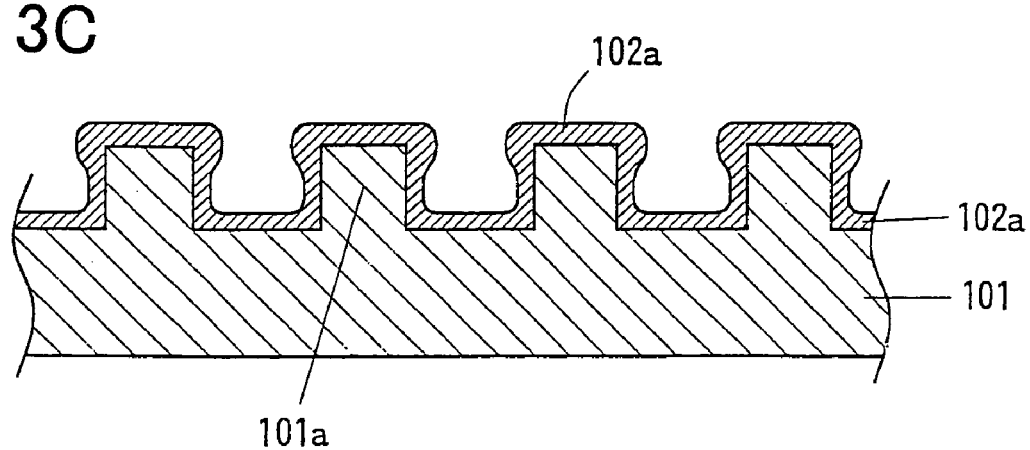

(b) About 0.3 μm of AlGaN buffer layer (first substrate layer) 102a was formed on the base substrate 101 by crystal growth through MOVPE under conditions controlled by keeping the temperature in the chamber to 1100° C. and concurrently supplying $H_2$, $NH_3$, TMG, and TMA (FIGS. 3A–3C).

(c) About 5 μm of GaN layer 102b, which was a part of a second substrate layer, was formed on the AlGaN buffer layer (first substrate layer) 102a by crystal growth under conditions controlled by keeping the temperature to 1075° C. and concurrently supplying $H_2$, $NH_3$, and TMG. As a result, as shown in FIGS. 4A–4C, a portion of the second substrate layer (GaN layer 102b) grows in lateral direction and a large cavity is obtained at each valley part, or sidewall of the projection part 101a.

Here supplying rate of TMG was about 40 μmol/min, and crystal growth velocity of the second substrate layer (GaN layer 102b) was about 1 μm/Hr.

(d) Then the GaN layer (second substrate layer) 102b was further grown by crystal growth through halide vapor phase growth (HVPE) until its thickness became 200 μm. Crystal growth velocity of the GaN layer 102b though HVPE was about 45 μm/Hr.

[3] Separating process (a) After the crystal growing process, the base substrate 101 and the substrate layer 102 (comprising the AlGaN buffer layer 102a and the GaN layer 102b) were cooled to ambient temperature under conditions of supplying ammonia ($NH_3$) gas to a reaction chamber of the crystal growth apparatus. Here velocity of cooling the layers was about −50° C./min to −5° C./min.

(b) The base substrate 101 and the substrate layer 102 were taken from the reaction chamber of the crystal growth apparatus, and then GaN crystal exfoliated (or peeled off) from the base substrate 101 was obtained. Here the crystal obtained through this process was the GaN layer 102b on whose back surface small pieces of remain of the AlGaN buffer layer 102a and rupture remains of the projection part 101a were left.

[4] Rupture remains removing process

After carrying out the above separating process, rupture remains of the projection part 101a which was made of Si and remaining on the back surface of the GaN crystal were removed through etching treatment using a mixture of hydrofluoric acid and nitric acid.

Accordingly, a GaN crystal (GaN layer 102b) having thickness of about 200 μm and excellent crystallinity, which is a desired free-standing semiconductor substrate independent from the base substrate 101, was obtained through the method described above.

In the first embodiment, each projection part and valley part of the base substrate has a horizontal surface and a vertical surface as shown in FIGS. 2A–2C. Alternatively, the projection parts and valley parts may be constituted by an arbitral surface such as a slant face and a curved surface. Accordingly, sectional shape of a valley part formed on the base substrate as illustrated in FIG. 2C may be a concave shape of an approximately rectangle and also it may be formed in an approximately U shape or V shape. Generally conditions of a valley part such as shape, size, interval, arrangement, and orientation are arbitral.

Next a second embodiment of the present invention will be described. Here the second embodiment corresponds to the twenty-third to the forty-third aspects described above.

On carrying out the present invention, each producing condition may be chosen from the followings. Also each producing condition may be combined arbitrary with each other.

Firstly, Group III nitride compound semiconductor layers are preferably formed through metal-organic vapor phase growth (MOCVD or MOVPE). Other growth methods, such as molecular-beam epitaxy (MBE), halide vapor phase growth (halide VPE), and liquid phase growth (LPE), may also be employed. Moreover, the respective layers may be formed through different methods.

Preferably, a buffer layer is appropriately provided in the crystal growth substrate or formed on such as the base substrate, for several reasons, such as compensation of lattice mismatch.

Particularly, when the buffer layer (intermediate layer) is provided in the semiconductor substrate (the substrate crystal A), the buffer layer is preferably formed from a Group III nitride compound semiconductor $Al_xGa_yIn_{1-x-y}N$ ($0 \leq x \leq 1$; $0 \leq y \leq 1$; $0 \leq x+y \leq 1$) which is formed at low temperature, more preferably $Al_xGa_{1-x}N$ ($0 \leq x \leq 1$). The buffer layer may be a single layer or a multi-layer comprising a plurality of sub layers of different compositions. The buffer layer may be formed at a low temperature (380–420° C.), or may be formed at 1000-1180° C. through MOCVD. Alternatively, a buffer layer comprising AlN may be formed through reactive sputtering by use of a DC magnetron sputtering apparatus, from high-purity metallic aluminum and nitrogen gas serving as raw materials.

The buffer layer comprising a compound semiconductor represented by formula $Al_xGa_yIn_{1-x-y}N$ ($0 \leq x \leq 1$; $0 \leq y \leq 1$; $0 \leq x+y \leq 1$; arbitrary compositional proportions) can be formed through physical vapor deposition such as vapor deposition, ion plating, laser ablation, or ECR. The buffer layer is preferably formed through physical vapor deposition at 200–600° C., more preferably 300–600° C., most preferably 350–450° C. The buffer layer which is formed through physical vapor deposition such as sputtering preferably has a thickness of 100–3,000 Å, more preferably 100–400 Å, most preferably 100–300 Å.

A buffer layer of multi-layer type is formed through any of several methods. For example, an $Al_xGa_{1-x}N$ ($0 \leq x \leq 1$) layer and a GaN layer are alternately formed, or a semiconductor layer of the same composition is alternately formed at different temperatures, such as 600° C. or lower and 1000° C. or higher. These two methods may be employed in combination. The multi-layer buffer layer may be formed by stacking at least three species selected from Group III nitride compound semiconductors represented by $Al_xGa_yIn_{1-x-y}N$ ($0 \leq x \leq 1$; $0 \leq y \leq 1$; $0 \leq x+y \leq 1$). Generally, a buffer layer is made of amorphous and an intermediate layer is made of monocrystalline. Repetitions of unit of a buffer layer and an intermediate layer may be formed, and the number of repetitions is not particularly limited. The larger the number of repetitions are, the greater the improvement in crystallinity becomes.

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms.

In this case, since acceptor impurities easily occupy the positions of Group III atoms, p-type crystals can be obtained as grown. Through the thus-attained improvement of crystallinity combined with the features of the present invention, threading dislocation can be further reduced to approximately 1/100 to 1/1000. In the case of an underlying layer containing two or more repetitions of a buffer layer and a Group III nitride compound semiconductor layer, the Group III nitride compound semiconductor layers are further preferably doped with an element greater in atomic radius than a predominant component element. When a light-emitting element is produced, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Dislocations occurring in a Group III nitride compound semiconductor layer can also be reduced through employment of lateral epitaxial growth. In this case, lateral epitaxial growth can be performed in an arbitrary manner; e.g., by use of a mask or through employment of etching for leveling a step and supplying the step as seed for executing ELO between steps.

The aforementioned etching mask may be formed from a polycrystalline semiconductor such as polycrystalline silicon or polycrystalline nitride semiconductor; an oxide or nitride such as silicon oxide ($SiO_x$), silicon nitride ($SiN_x$), titanium oxide ($TiO_x$), or zirconium oxide ($ZrO_x$); or a high-melting-point metal such as titanium (Ti) or tungsten (W). A multi-layer film of these materials may also be employed. The film can be formed through any film formation method such as vapor phase growth (e.g., vapor deposition, sputtering, or CVD).

Although reactive ion beam etching (RIBE) is a preferred etching method, any other etching method can also be employed. A step having a surface of a side wall which is not normal to the substrate plane may be formed. For example, a step which does not have a flat surface on the bottom of the substrate and which has a V-shape cross-section may be formed through anisotropic etching.

A semiconductor device, such as an FET or a light-emitting device, can be formed on the aforementioned Group III nitride compound semiconductor. In the case where a light-emitting device is formed, a light-emitting layer may have a multi-quantum well (MQW) structure, a single-quantum well (SQW) structure, a homo-structure, a single-hetero-structure, or a double-hetero-structure, or the layer may be formed by means of, for example, a pin junction or a pn junction.

Embodiments of the present invention will next be described. The present invention is not limited to the embodiments described below.

Second Embodiment

In the following Example, a method for producing a semiconductor crystal (crystal growth substrate) according to a second embodiment of the present invention will be described.

[1] Reaction Prevention process

A reaction prevention process is a process for depositing a reaction prevention layer on a base substrate (Si substrate).

In this process, first, about 1.5 μm in thickness of a reaction prevention layer made of silicon carbide (SiC) is formed on the Si (111) substrate through chemical vapor deposition (CVD). In order to prevent a wafer from curving, a SiC film may be formed on both the surface and the back surface of the substrate. Alternatively, the silicon carbide (SiC) may be formed through metal-organic vapor phase growth (MOCVD).

[2] Projection part forming process

Projection parts B1 each having diameter of approximately 1 μm and a height of approximately 1 μm are formed in an approximately columnar shape on the reaction prevention layer at an interval of about 2 μm through dry-etching using photolithography (FIG. 6). Each of the projection part B1 is arranged so that the center of the columnar bottom is placed at each lattice point of a two-dimensional triangle lattice based on an approximately equilateral triangle whose edge is about 2 μm. Here a thickness of the base substrate 111 is about 200 μm.

[3] Crystal growing process

Figure 8A:
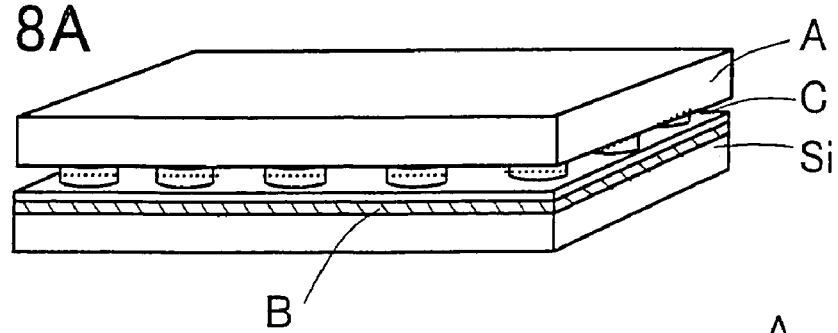
FIGS. 8A–8C are schematic perspective view, plan view, and sectional view of a base substrate on which a semiconductor substrate (semiconductor crystal A) is laminated.
Figure 8B:
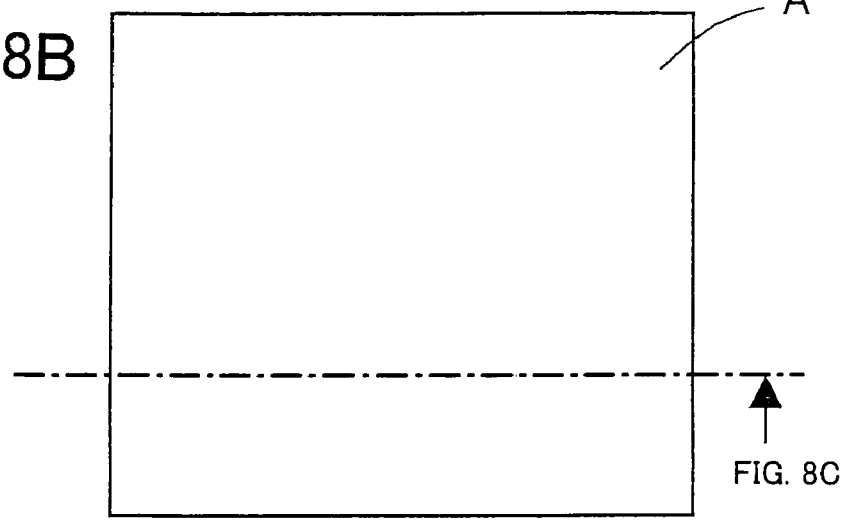
Figure 8C:
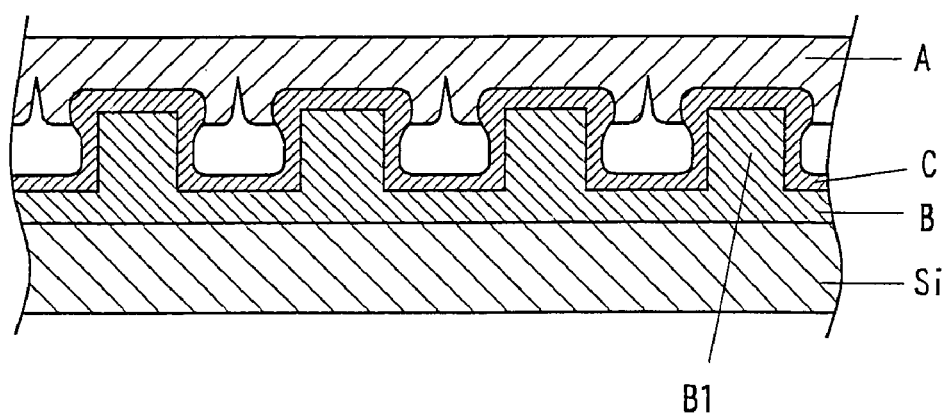
Figure 10:
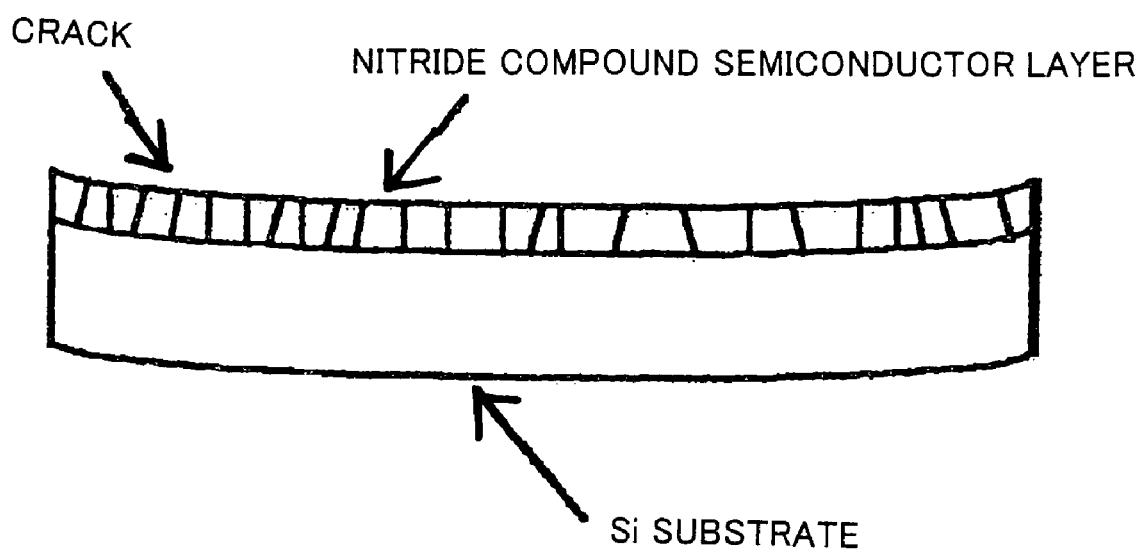
FIG. 10 is a schematic sectional view of a semiconductor crystal formed on a conventional base substrate.
Figure 11:
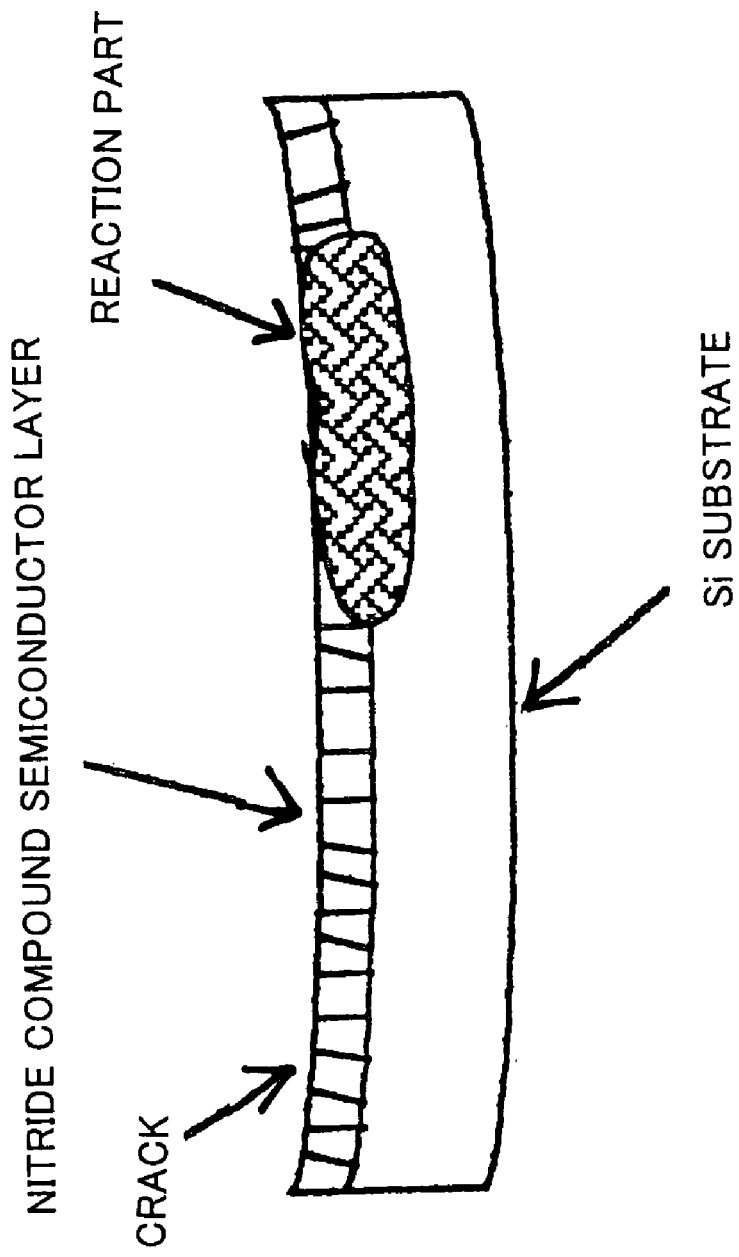
FIG. 11 is a schematic sectional view of a conventional semiconductor crystal formed on a Si substrate (base substrate).

In the crystal growing process, the upper surface of the projection part B1 (at an initial state) is connected with each other to be a series of an approximately plane growth surface of a crystal as shown in FIGS. 8A-8C through metal-organic vapor phase epitaxy (hereinafter called "MOVPE"). After that the substrate layer (crystal layer) is grown to have a thickness of about 200 μm through halide vapor phase growth (HVPE).

In this process, the following gasses were employed: ammonia ($NH_3$), carrier gas ($H_2$ or $N_2$), trimethylgallium ($Ga(CH_3)_3$, hereinafter called "TMG"), and trimethylaluminum ($Al(CH_3)_3$, hereinafter called "TMA").

(a) The base substrate on which the projection parts B1 are formed (shown in FIGS. 2A–2C) was placed on a susceptor in a reaction chamber for the MOVPE treatment after it has been cleaned by an organic washing solvent and acid treatment. Then the base substrate 101 was baked at 1100° C. in $H_2$ vapor fed into the chamber under normal pressure.

(b) About 0.2 μm of AlGaN buffer layer (buffer layer C) was formed on the base substrate by crystal growth through MOVPE under conditions controlled by keeping the temperature in the chamber to 1100° C. and concurrently supplying $H_2$, $NH_3$, TMG, and TMA (FIGS. 3A–3C).

(c) About 5 μm of GaN layer A, which is a part of a second substrate layer, was formed on the AlGaN buffer layer (buffer layer C) by crystal growth under conditions controlled by keeping the temperature to 1075° C. and concurrently supplying $H_2$, $NH_3$, and TMG. As a result, as shown in FIGS. 8A–8C, a portion of the semiconductor substrate (GaN layer A) grows in lateral direction and a large cavity is obtained at each valley part, or sidewall of the projection part B1.

Here supplying rate of TMG was about 40 μmol/min, and crystal growth velocity of the GaN layer (semiconductor crystal A) was about 1 μm/Hr.

(d) Then the GaN layer (semiconductor crystal A) was further grown by crystal growth through halide vapor phase growth (HVPE) until its thickness became 200 μm. Crystal growth velocity of the GaN layer 102b though HVPE was about 45 μm/Hr.

[4] Separating process (a) After the crystal growing process, a wafer comprising the base substrate (Si substrate) was cooled to ambient temperature under conditions of supplying ammonia ($NH_3$) gas to a reaction chamber of the crystal growth apparatus. Here velocity of cooling the layers may be about −50° C./min to −5° C./min.

(b) The wafer comprising the base substrate (Si substrate) was taken from the reaction chamber of the crystal growth apparatus, and then GaN crystal (semiconductor crystal A) exfoliated (or peeled off) from the base substrate (Si substrate) was obtained. Here the crystal obtained through this process was the GaN layer (semiconductor substrate) on whose back surface small pieces of remain of the AlGaN buffer layer C and rupture remains of the projection part B1 were left.

[5] Rupture remains removing process

After carrying out the above separating process, rupture remains of the projection part B1 which was made of Si and remaining on the back surface of the GaN crystal were removed through wrapping process.

Here this removing process may be carried out through etching treatment using a mixture of hydrofluoric acid and nitric acid.

Accordingly, a GaN crystal (GaN layer) having a thickness of about 200 μm and excellent crystallinity, which is a desired free-standing semiconductor substrate (semiconductor crystal A) independent from the base substrate, was obtained through the method described above.

Alternatively, materials such as AlN and $Al_xGa_{1-x}N$ ($0.30 \leq x \leq 1$) may be used as monocrystalline material B for forming the reaction prevention layer to obtain approximately same action and effect as in this embodiment. More generally, silicon carbide (SiC, 3C-SiC), aluminum nitride (AlN), spinel ($MgAl_2O_4$), or AlGaN, AlInN and AlGaInN whose aluminum composition ratio is at least 0.30 and more may be used as monocrystalline material B for forming the reaction prevention layer.

The semiconductor crystal A which forms an objective semiconductor substrate is not limited to gallium nitride (GaN) but may be selected from the above-mentioned group III nitride compound semiconductor.

Alternatively, the objective semiconductor substrate (semiconductor crystal A) may have a multiple layer structure.

Figure 6A:
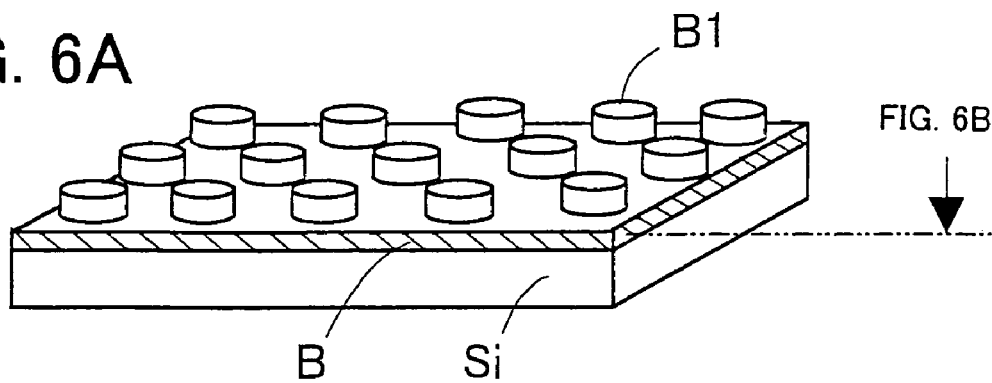
FIGS. 6A–6C are schematic perspective view, plan view, and sectional view of a part of a base substrate (Si substrate) according to the second embodiment of the present invention.
Figure 6B:
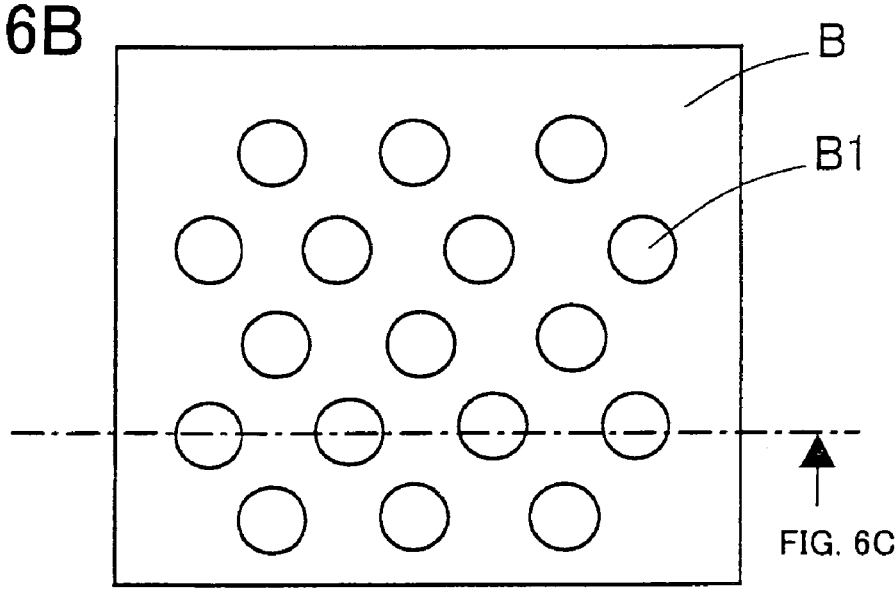
Figure 6C:
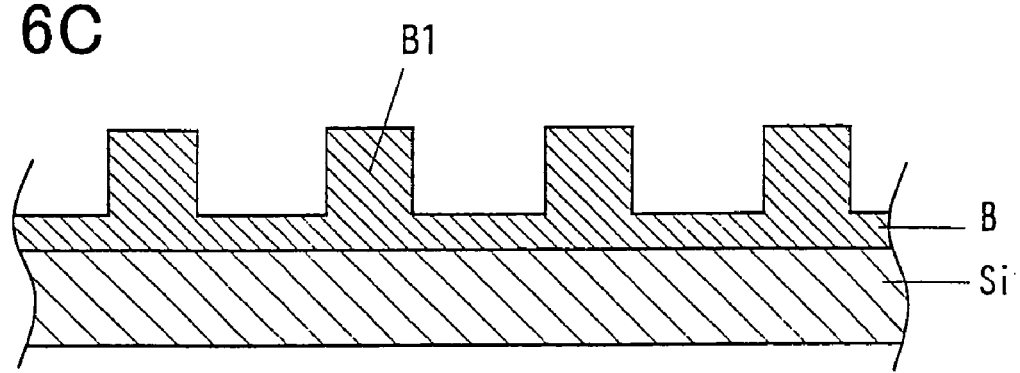
Figure 7A:
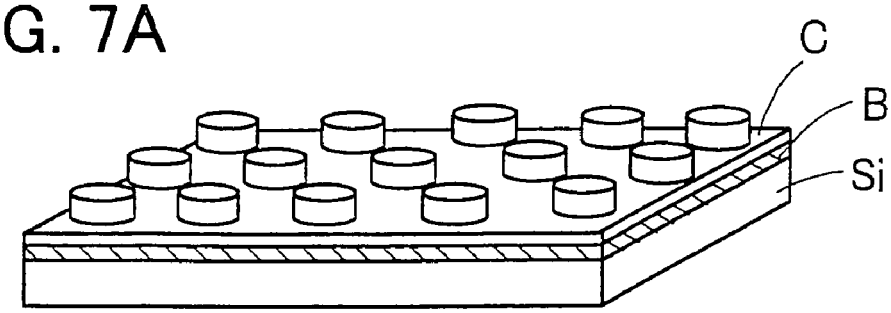
FIGS. 7A–7C are schematic perspective view, plan view, and sectional view of a base substrate on which a buffer layer C (AlGaN layer) is formed.
Figure 7B:
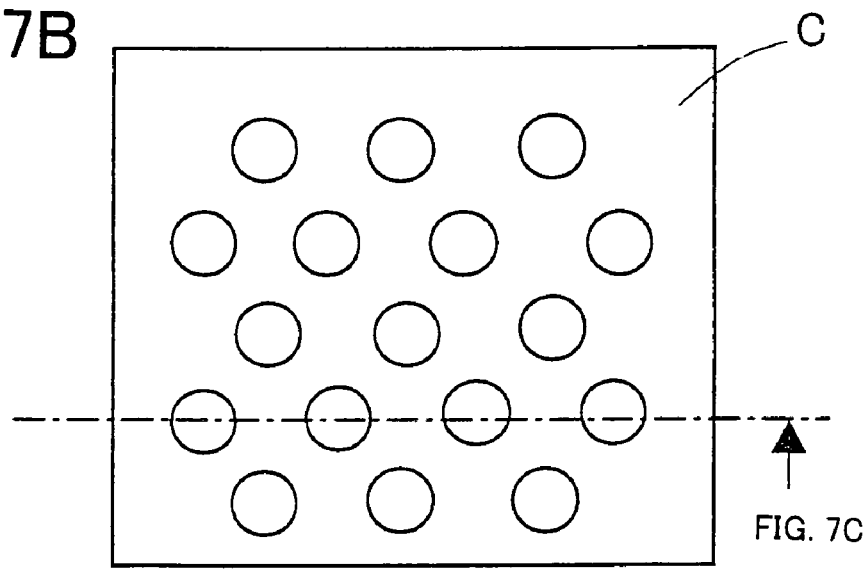
Figure 7C:
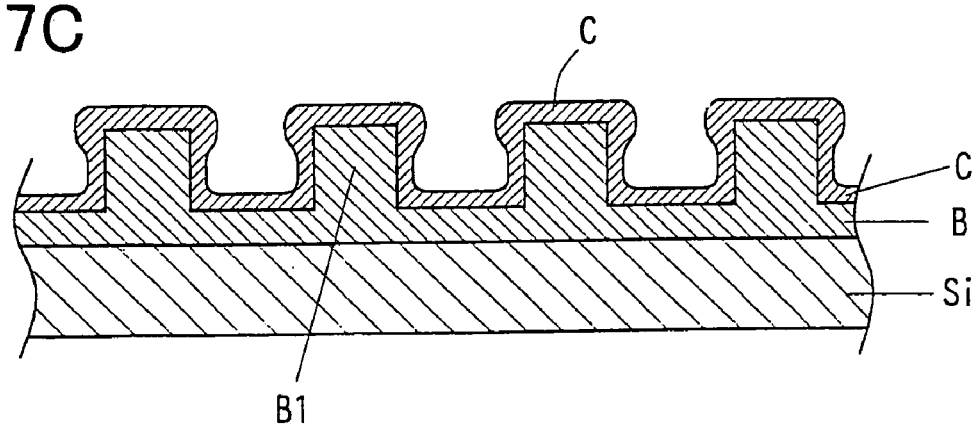

In the second embodiment, each projection part and valley part of the base substrate is constituted by a horizontal surface and a vertical surface as shown in FIGS. 6A–6C. Alternatively, the projection parts and valley parts may have an arbitral surface such as a slant face and a curved surface. Accordingly, sectional shape of a valley part formed on the base substrate as illustrated in FIG. 2C may be a concave shape of an approximately rectangle and it may be formed in an approximately U shape or V shape. Generally conditions of a valley part such as shape, size, interval, arrangement, and orientation are arbitral.

Next a third embodiment of the present invention will be described. Here the third embodiment corresponds to the forty-fourth to the fifty-fifth aspects described above.

On carrying out the present invention, each producing condition may be chosen from the followings. Also each producing condition may be combined arbitrary with each other.

Third Embodiment

1. Seed depositing process

In this embodiment, a seed layer (group III nitride compound semiconductor) comprising a first seed layer (AlN buffer layer 102) and a second seed layer (GaN layer 103) was formed through metal-organic vapor phase epitaxy ("MOVPE" hereinafter). In this process, the following gasses were employed: ammonia ($NH_3$), carrier gas ($H_2$ or $N_2$), trimethylgallium ($Ga(CH_3)_3$, hereinafter called "TMG"), and trimethylaluminum ($Al(CH_3)_3$, hereinafter called "TMA").

FIGS. 9A–9C are schematic sectional views of a semiconductor crystal illustrating producing process of the semiconductor crystal of the present invention.

First, a sapphire substrate 101 (base substrate) which is 1 inch square and has a thickness about 250 μm was cleaned by organic washing solvent and heat treatment (baking). Then about 200 nm in thickness of AlN buffer layer 102 (first seed layer) was formed by crystal growth on a main surface 'a' of the single crystalline base substrate 101, which serves as a crystal growth surface, under conditions controlled by keeping the temperature about 400° C. and concurrently supplying $H_2$, $NH_3$ and TMA at a flow rate of 10 liter/min., 5 liter/min. and 20 μmol/min., respectively.

About 1.5 μm of GaN layer 103 (second seed layer) was formed on the AlN buffer layer 102 under conditions controlled by raising the temperature of the sapphire substrate 101 to 1000° C. and concurrently supplying $H_2$, $NH_3$ and TMG at a flow rate of 20 liter/min., 10 liter/min. and 300 μmol/min., respectively (FIGS. 9A–9D).

2. Erosion remains part forming process

By use of a hard bake resist mask, stripe-shaped erosion remains parts were formed at arrangement period L≈20 μm through selective dry etching employing reactive ion etching (RIE) (FIG. 9B).

That is, width of a stripe (width S of a seed) ≈5 μm and width W of a wing ≈15 μm. Etching was carried out in a stripe pattern until the substrate is etched in depth of 0.1 μm, to thereby form erosion remains parts whose sectional view is approximately a rectangular shape. The resist mask was formed so that the sidewalls of the stripe-shaped erosion remains parts were caused to serve as the {11–20} planes of the GaN layer 103 (second seed layer). By carrying out this etching, the stripe-shaped erosion remains parts which has a seed layer comprising the GaN layer 103 (second seed layer) and the AlN buffer layer 102 (first seed layer) on the top surface were formed approximately periodically and a portion of the sapphire substrate 101 was exposed at the valley part of the wing.

3. Crystal growing process

Next, an objective semiconductor crystal A made of GaN single crystal was formed through HVPE while the exposed portions of the stripe-shaped erosion remains parts served as the initial crystal growth fronts.

Finally the objective semiconductor crystal A was grown by crystal growth until its thickness becomes about 250 μm. At the early stage of the growing process the GaN grows both in lateral and longitudinal directions. After each parts of the GaN layer is connected with each other and grows to become at least a series of approximately flat surface, the GaN grows in longitudinal direction.

In this embodiment, transversal-type HVPE was employed. And ammonia ($NH_3$) was used as a group V material and gallium chloride (GaCl) obtained by reacting Ga and HCl was used as a group III material.

Accordingly, the exposed portions arranged at each side of the seed layer are buried primarily by lateral epitaxial growth, and then a semiconductor crystal A (GaN single crystal) having a desired thickness can be obtained by longitudinal growth (FIG. 9C). Here a sign R in FIG. 9C represents a cavity.

4. Separation process

The semiconductor crystal A was cooled down from 1100° C. to approximately ambient temperature at a cool rate of 1.5° C./min. As a result, exfoliation (or peeling off) occurs around the AlN buffer layer 102 (first seed layer), to thereby obtain the free-standing semiconductor crystal A (GaN single crystal) which has a desired thickness and is independent from the base substrate 101 as shown in FIG. 9D.

Further, in addition to the buffer layer, a middle layer having approximately the same composition (e.g., AlN, AlGaN) as the AlN buffer layer 102 may be formed periodically, alternatively with other layers, or deposited to comprise a multiple layer structure.

By deposition such a buffer layer (or a middle layer), stress caused by difference of lattice constants and acting to the semiconductor crystal A may be relaxed by the same action principle as the conventional one, to thereby improve crystallinity of the device.

In the separation process, in order to decrease a temperature of the base substrate and the substrate crystal A, they may be left in a reaction chamber of a growth apparatus and cooled to approximately ambient temperature at a cooling rate of about −100° C./min to −0.5° C./min under condition that ammonia ($NH_3$) gas is flown at an approximately constant flowing rate. When the cooling rate is too fast, cracks may be generated in the semiconductor crystal A.

Alternatively, the separation process may be carried out by employing the stress caused by difference of lattice constants of the base substrate and the semiconductor crystal A in the middle of the crystal growing process.

While the present invention has been described with reference to the above embodiments as the most practical and optimum ones, the present invention is not limited thereto, but may be modified as appropriate without departing from the spirit of the invention.

The invention claimed is:

1. A method for producing a semiconductor crystal in which a semiconductor substrate is formed by growing a semiconductor crystal A comprising group III nitride compound semiconductor on a base substrate, which is made of silicon (Si), by using lateral crystal growth, comprising:

a reaction prevention process for forming a reaction prevention layer, which is made of a material B whose melting point is higher than that of the semiconductor crystal A, on said base substrate;

a projection part forming process for forming numbers of projection parts from said reaction prevention layer by employing chemical or physical etching, without exposing the side of said base substrate on which said reaction prevention layer is formed; and a crystal growing process wherein at least a portion of the surface of said projection part is used as an initial growth surface on which crystal growth of said semiconductor crystal A starts first, and said semiconductor crystal A is formed by crystal growth until each growth surface is connected to become a series of an approximately flat surface, wherein AlGaN, AlInN, or AlGaInIN, in which aluminum composition ratio is at least 0.30 or more, is used as monocrystalline material B forming said reaction prevention layer.

2. A method for producing a semiconductor crystal according to claim 1, wherein a cavity in which said semiconductor crystal A is not deposited is formed at each interval of said projection parts by growing each growth surface in lateral direction and connecting it with each other.

3. A method for producing a semiconductor crystal according to claim 1, further comprising a separation process for separating said semiconductor crystal A and said base substrate, wherein stress owing to difference of thermal expansion coefficients is generated by cooling or heating said semiconductor crystal A and said base substrate, and said projection part is broken by using said stress.

4. A method for producing a semiconductor crystal according to claim 1, wherein the value of (b–a), or difference of crystal growth velocity 'b' of group III nitride compound semiconductor on the peak point of the projection part and crystal growth velocity 'a' of group III nitride compound semiconductor on at least a portion of said etched region of each concave, which is each interval of said projection parts of said base substrate, is controlled to become approximately maximum by controlling supply amount q of raw material of a group III nitride compound semiconductor in said crystal growing process.

5. A method for producing a semiconductor crystal in which a semiconductor substrate is formed by growing a semiconductor crystal A comprising group III nitride compound semiconductor on a base substrate, which is made of silicon (Si), by using lateral crystal growth, comprising:

a reaction prevention process for forming a reaction prevention layer, which is made of a material B whose melting point is higher than that of the semiconductor crystal A, on said base substrate;

a projection part forming process for forming numbers of projection parts from said reaction prevention layer by employing chemical or physical etching, without exposing the side of said base substrate on which said reaction prevention layer is formed; and a crystal growing process wherein at least a portion of the surface of said projection part is used as an initial growth surface on which crystal growth of said semiconductor crystal A starts first, and said semiconductor crystal A is formed by crystal growth until each growth surface is connected to become a series of an approximately flat surface, wherein said semiconductor crystal A comprises a group III nitride compound semiconductor having a composition of $Al_xGa_yIn_{(1-x-y)}N$ ($0 \leq x < 1$, $0 < y \leq 1$, $0 < x+y \leq 1$), wherein AlGaN, AlInN, or AlGaInN, in which aluminum composition ratio is at least 0.30 or more, is used as monocrystalline material B forming said reaction prevention layer.

* * * * *